(12) United States Patent
Wu et al.

(10) Patent No.: US 11,688,606 B2
(45) Date of Patent: *Jun. 27, 2023

(54) TUNING THRESHOLD VOLTAGE THROUGH META STABLE PLASMA TREATMENT

(71) Applicant: Taiwan Semiconductor Manufacturing Co., Ltd., Hsinchu (TW)

(72) Inventors: Shao-Jyun Wu, New Taipei (TW); Sheng-Liang Pan, Hsinchu (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/648,159

(22) Filed: Jan. 17, 2022

(65) Prior Publication Data
US 2022/0139712 A1    May 5, 2022

Related U.S. Application Data

(63) Continuation of application No. 16/740,878, filed on Jan. 13, 2020, now Pat. No. 11,239,083, which is a
(Continued)

(51) Int. Cl.
*H01L 21/02* (2006.01)
*H01L 21/28* (2006.01)
(Continued)

(52) U.S. Cl.
CPC ........ *H01L 21/28185* (2013.01); *G03F 7/091* (2013.01); *G03F 7/16* (2013.01);
(Continued)

(58) Field of Classification Search
CPC .......... H01L 21/0234; H01L 21/28185; H01L 21/0276; H01L 21/28088; H01L 21/28158;
(Continued)

(56) References Cited

U.S. PATENT DOCUMENTS

| | | |
|---|---|---|
| 6,436,747 B1 | 8/2002 | Swgawa et al. |
| 6,555,485 B1 | 4/2003 | Liu et al. |

(Continued)

FOREIGN PATENT DOCUMENTS

| | | |
|---|---|---|
| JP | H1022272 A | 1/1998 |
| JP | 2012524413 A | 10/2012 |

(Continued)

*Primary Examiner* — Eduardo A Rodela
(74) *Attorney, Agent, or Firm* — Slater Matsil, LLP

(57) ABSTRACT

A method includes forming a first high-k dielectric layer over a first semiconductor region, forming a second high-k dielectric layer over a second semiconductor region, forming a first metal layer comprising a first portion over the first high-k dielectric layer and a second portion over the second high-k dielectric layer, forming an etching mask over the second portion of the first metal layer, and etching the first portion of the first metal layer. The etching mask protects the second portion of the first metal layer. The etching mask is ashed using meta stable plasma. A second metal layer is then formed over the first high-k dielectric layer.

20 Claims, 23 Drawing Sheets

Related U.S. Application Data continuation of application No. 16/297,970, filed on Mar. 11, 2019, now Pat. No. 10,535,524.

(51) Int. Cl.

| | | |
|---|---|---|
| *H01L 21/8238* | (2006.01) | |
| *G03F 7/09* | (2006.01) | |
| *H01L 29/66* | (2006.01) | |
| *H01L 21/027* | (2006.01) | |
| *H01L 21/3213* | (2006.01) | |
| *H01L 27/092* | (2006.01) | |
| *H01L 29/08* | (2006.01) | |
| *H01L 29/49* | (2006.01) | |
| *G03F 7/16* | (2006.01) | |
| *G03F 7/20* | (2006.01) | |
| *G03F 7/26* | (2006.01) | |
| *H01L 21/32* | (2006.01) | |
| *H01L 21/30* | (2006.01) | |
| *H01L 21/3205* | (2006.01) | |
| *H01L 21/324* | (2006.01) | |

(52) U.S. Cl.
CPC ............... *G03F 7/20* (2013.01); *G03F 7/26* (2013.01); *H01L 21/0234* (2013.01); *H01L 21/0276* (2013.01); *H01L 21/02252* (2013.01); *H01L 21/28088* (2013.01); *H01L 21/28158* (2013.01); *H01L 21/28176* (2013.01); *H01L 21/28211* (2013.01); *H01L 21/30* (2013.01); *H01L 21/32* (2013.01); *H01L 21/324* (2013.01); *H01L 21/3205* (2013.01); *H01L 21/32136* (2013.01); *H01L 21/32139* (2013.01); *H01L 21/823814* (2013.01); *H01L 21/823821* (2013.01); *H01L 21/823842* (2013.01); *H01L 27/0924* (2013.01); *H01L 29/0847* (2013.01); *H01L 29/4966* (2013.01); *H01L 29/66545* (2013.01)

(58) Field of Classification Search
CPC ........ H01L 21/28176; H01L 21/28211; H01L 21/30; H01L 21/32; H01L 21/3205; H01L 21/32136; H01L 21/32139; H01L 21/324; H01L 21/823814; H01L 21/823821; H01L 21/823842; H01L 27/0924; H01L 29/0847; H01L 29/4966; H01L 29/66545; G03F 7/091; G03F 7/16; G03F 7/20; G03F 7/26

See application file for complete search history.

(56) References Cited

U.S. PATENT DOCUMENTS

| | | |
|---|---|---|
| 7,498,271 B1 | 3/2009 | Donation et al. |
| 8,436,427 B2 | 5/2013 | Chudzik et al. |
| 8,524,102 B2 | 9/2013 | Yamazaki |
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,157 B1 | 1/2018 | Murray et al. |
| 9,859,386 B2 | 1/2018 | Ho et al. |
| 10,014,192 B2 | 7/2018 | Singh |
| 10,353,324 B2* | 7/2019 | Oura .................. G03G 15/1675 |
| 10,535,524 B1 | 1/2020 | Wu et al. |
| 2002/0073925 A1 | 6/2002 | Noble et al. |
| 2005/0035085 A1 | 2/2005 | Stowell et al. |
| 2006/0081939 A1 | 4/2006 | Akasaka et al. |
| 2008/0176388 A1 | 7/2008 | Carter |
| 2010/0258881 A1 | 10/2010 | Chudzik et al. |
| 2013/0149468 A1 | 6/2013 | Sato et al. |
| 2014/0252502 A1 | 9/2014 | Grill et al. |
| 2016/0027664 A1 | 1/2016 | Ando et al. |
| 2017/0154825 A1 | 6/2017 | Edge et al. |
| 2018/0017487 A1 | 1/2018 | Backman et al. |

FOREIGN PATENT DOCUMENTS

| | | |
|---|---|---|
| KR | 20140051962 A | 5/2014 |
| TW | 200610052 A | 3/2006 |
| TW | 201839846 A | 11/2018 |

\* cited by examiner

US 11,688,606 B2

TUNING THRESHOLD VOLTAGE THROUGH META STABLE PLASMA TREATMENT

PRIORITY CLAIM AND CROSS-REFERENCE

This application is a continuation of U.S. patent application Ser. No. 16/740,878, entitled "Tuning Threshold Voltage Through Meta Stable Plasma Treatment," filed on Jan. 13, 2020, which is a continuation of U.S. patent application Ser. No. 16/297,970, entitled "Tuning Threshold Voltage Through Meta Stable Plasma Treatment," filed on Mar. 11, 2019, now U.S. Pat. No. 10,535,524 issued on Jan. 14, 2020, which applications are incorporated herein by reference.

BACKGROUND

Metal-Oxide-Semiconductor (MOS) devices are basic building elements in integrated circuits. Recent development of the MOS devices includes forming replacement gates, which include high-k gate dielectrics and metal gate electrodes over the high-k gate dielectrics. The formation of a replacement gate typically involves depositing a high-k gate dielectric layer and metal layers over the high-k gate dielectric layer, and then performing Chemical Mechanical Polish (CMP) to remove excess portions of the high-k gate dielectric layer and the metal layers. The remaining portions of the metal layers form the metal gates.

In conventional formation methods of the MOS devices, the threshold voltages of the MOS devices may be changed by performing a thermal anneal process when conducting ammonia to treat the high-k dielectric layers. Although the threshold voltage can be changed, it was impossible to adjust the threshold voltages to intended values, and further adjustment had to be achieved by adopting different work-function metals and adjusting the thickness of the work-function metals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
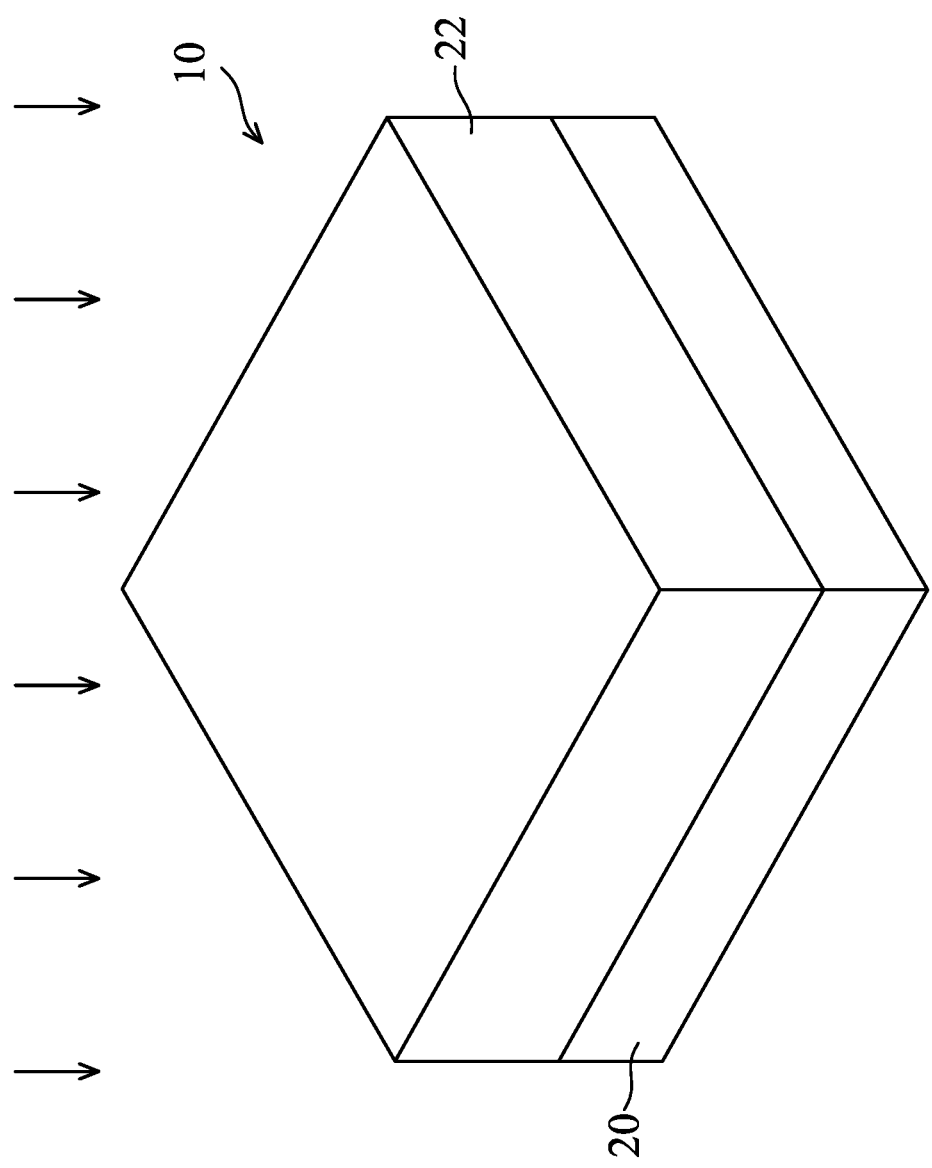
FIGS. 1-6, 7A, 7B, and 8-16 illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of adjusting the threshold voltages of the transistors are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors and Gate-All-Around (GAA) transistors may also adopt the concept of the present disclosure.

In accordance with some embodiments of the present disclosure, an ashing process for removing a Bottom Anti-Reflective Coating (BARC), which is used for patterning a layer (which may be a metal layer such as a work-function metal) on top of a gate dielectric layer, is utilized to adjust the threshold voltages of FinFETs. The flow rate of nitrogen, which is used for removing the BARC, is adjusted to adjust the threshold of the corresponding FinFETs to desirable values.

Figure 22:
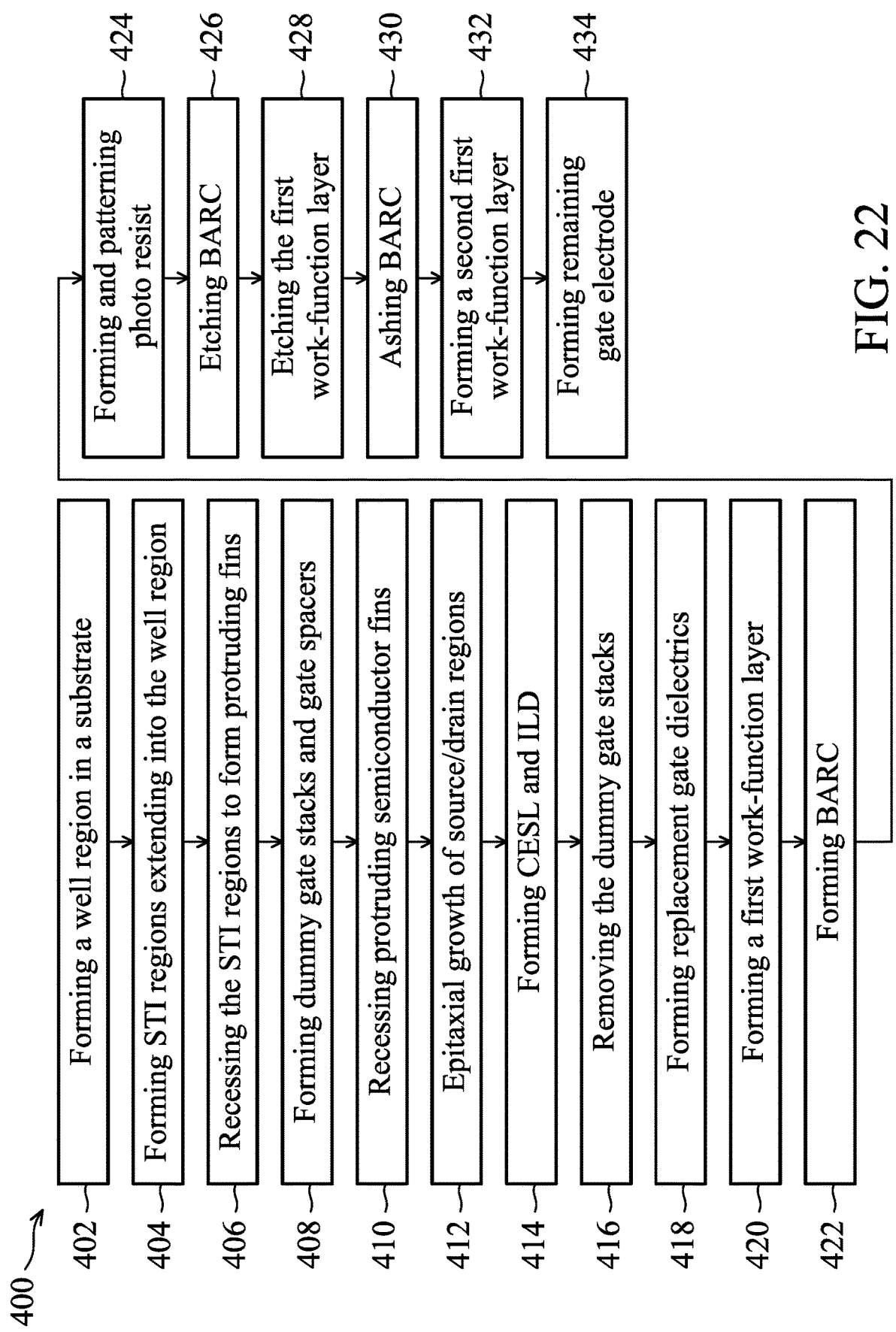
FIG. 22 illustrates a process flow for forming FinFETs in accordance with some embodiments.

FIGS. 1-6, 7A, 7B, and 8-16 illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 as shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 as shown in FIG. 22. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
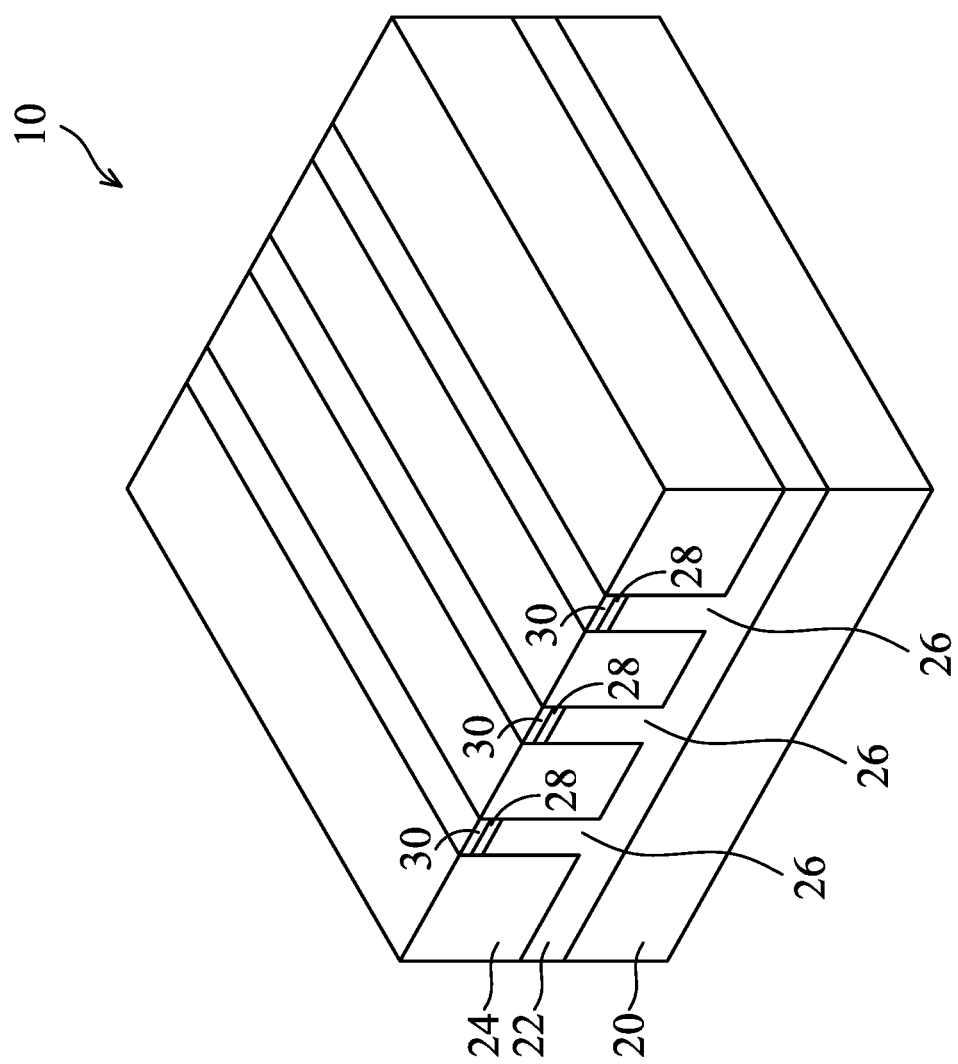

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 22. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
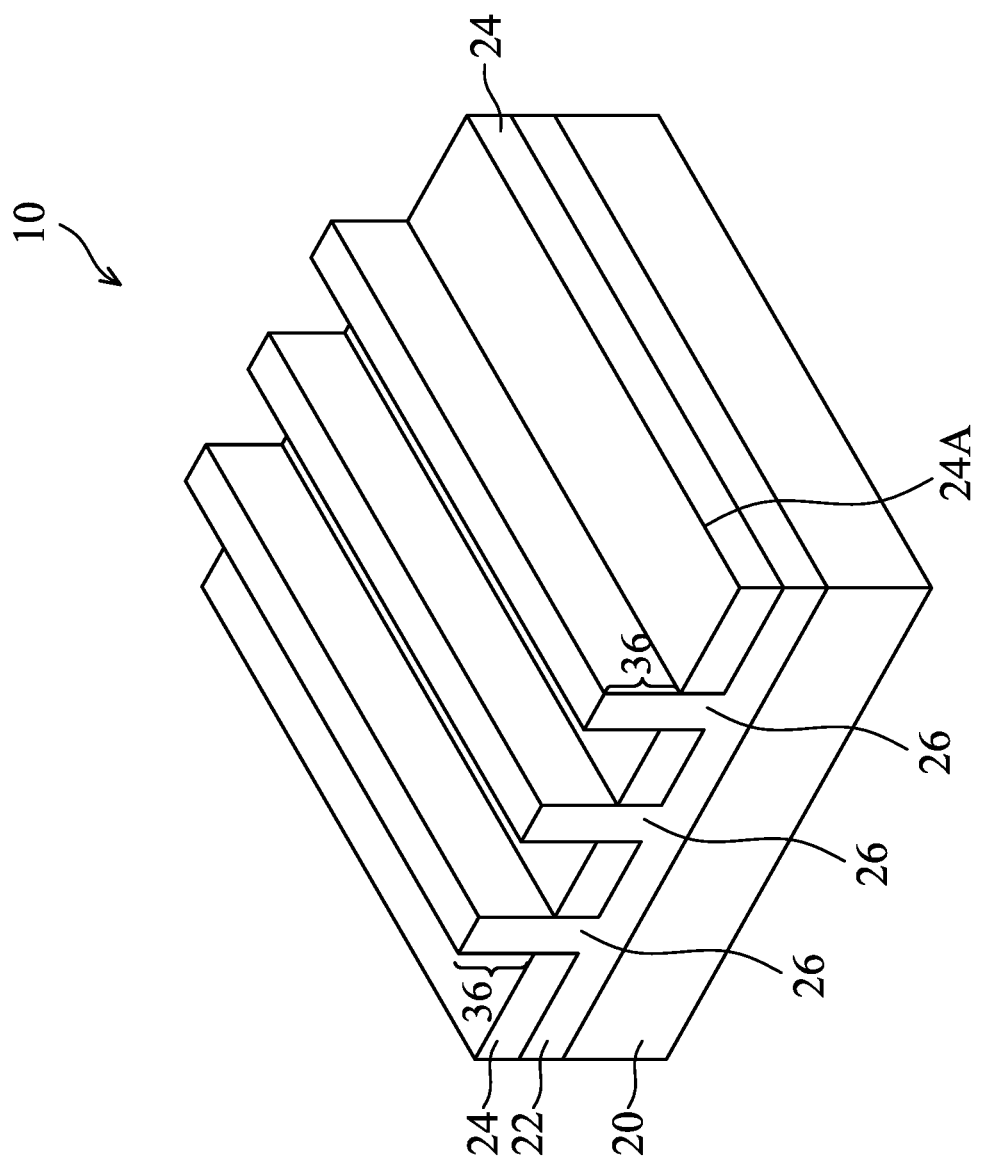

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 as shown in FIG. 22. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
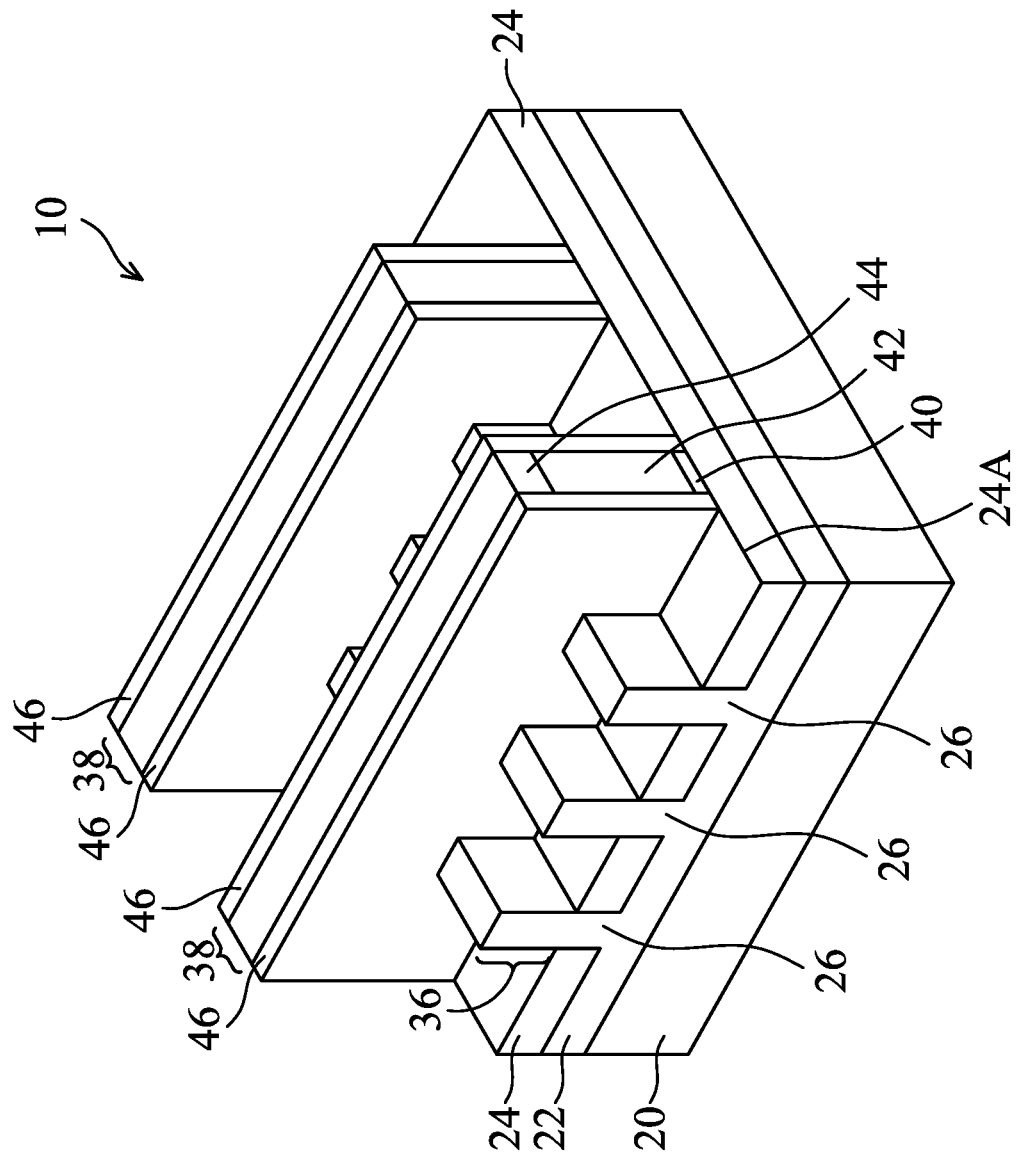

Referring to FIG. 4, dummy gate stacks 38 are formed to extend on the top surfaces and the sidewalls of (protruding) fins 36. The respective process is illustrated as process 408 in the process flow 400 as shown in FIG. 22. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24.

Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 as shown in FIG. 22. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
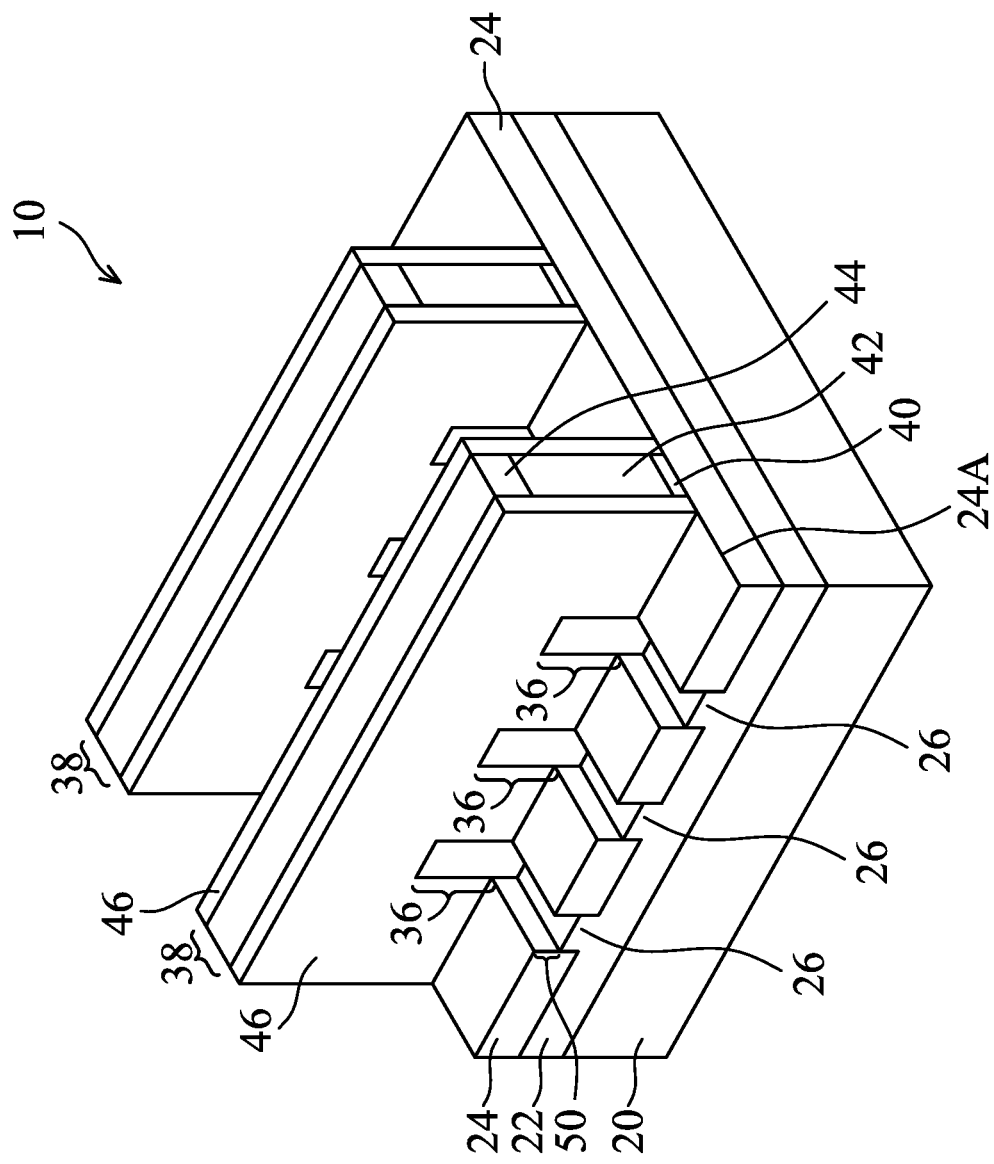

An etching process is then performed to etch the portions of protruding fins 36 that are not covered by dummy gate stacks 38 and gate spacers 46, resulting in the structure shown in FIG. 5. The respective process is illustrated as process 410 in the process flow 400 as shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
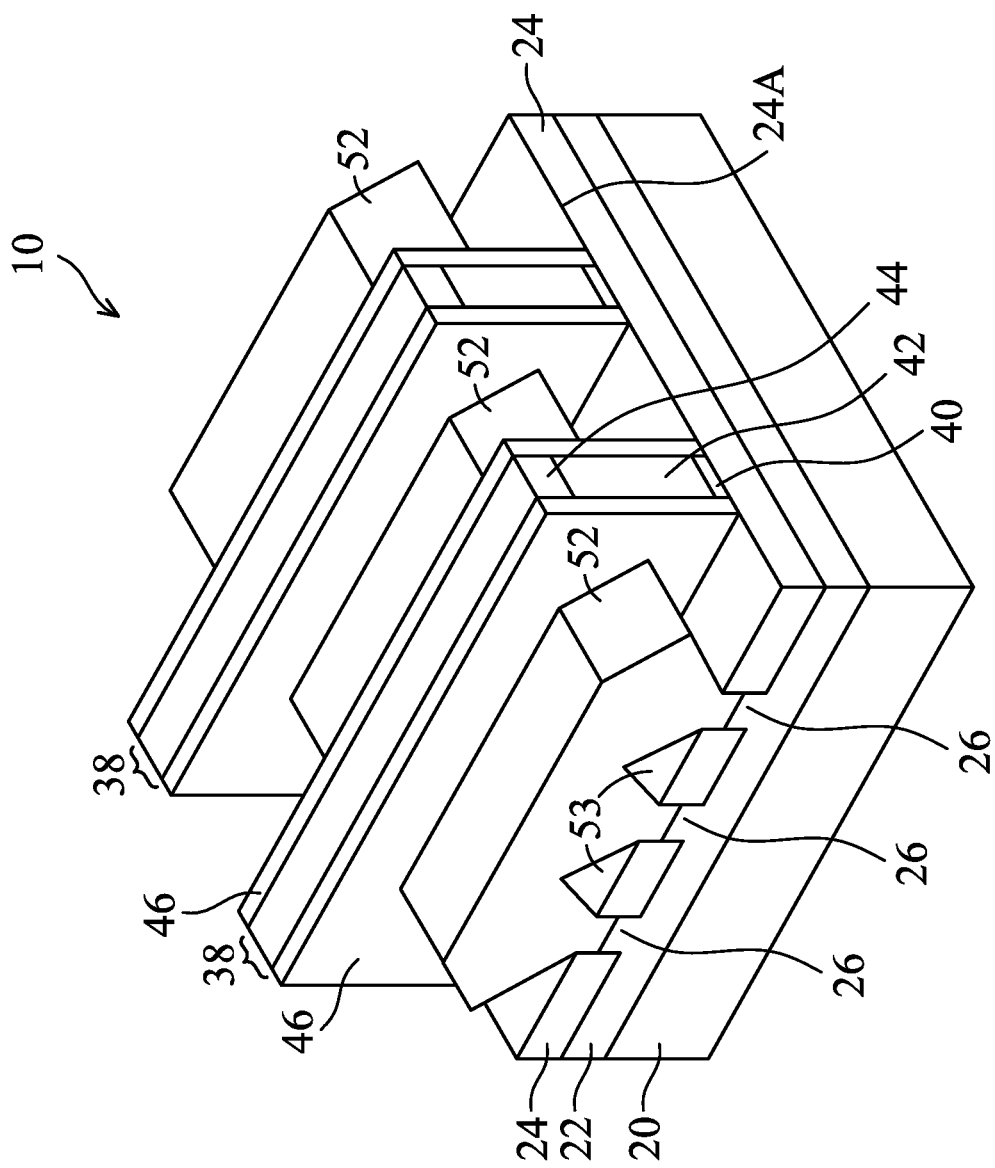

Next, epitaxy regions (source/drain regions) 52 are formed by selectively growing (through epitaxy) a semiconductor material in recesses 50, resulting in the structure in FIG. 6. The respective process is illustrated as process 412 in the process flow 400 as shown in FIG. 22. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 52 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated. In accordance with some embodiments of the present disclosure, the formation of epitaxy regions 52 may be finished when the top surface of epitaxy regions 52 is still wavy, or when the top surface of the merged epitaxy regions 52 has become planar, which is achieved by further growing on the epitaxy regions 52 as shown in FIG. 6.

After the epitaxy step, epitaxy regions 52 may be further implanted with a p-type or an n-type impurity to form source and drain regions, which are also denoted using reference numeral 52. In accordance with alternative embodiments of the present disclosure, the implantation process is skipped when epitaxy regions 52 are in-situ doped with the p-type or n-type impurity during the epitaxy.

Figure 7A:
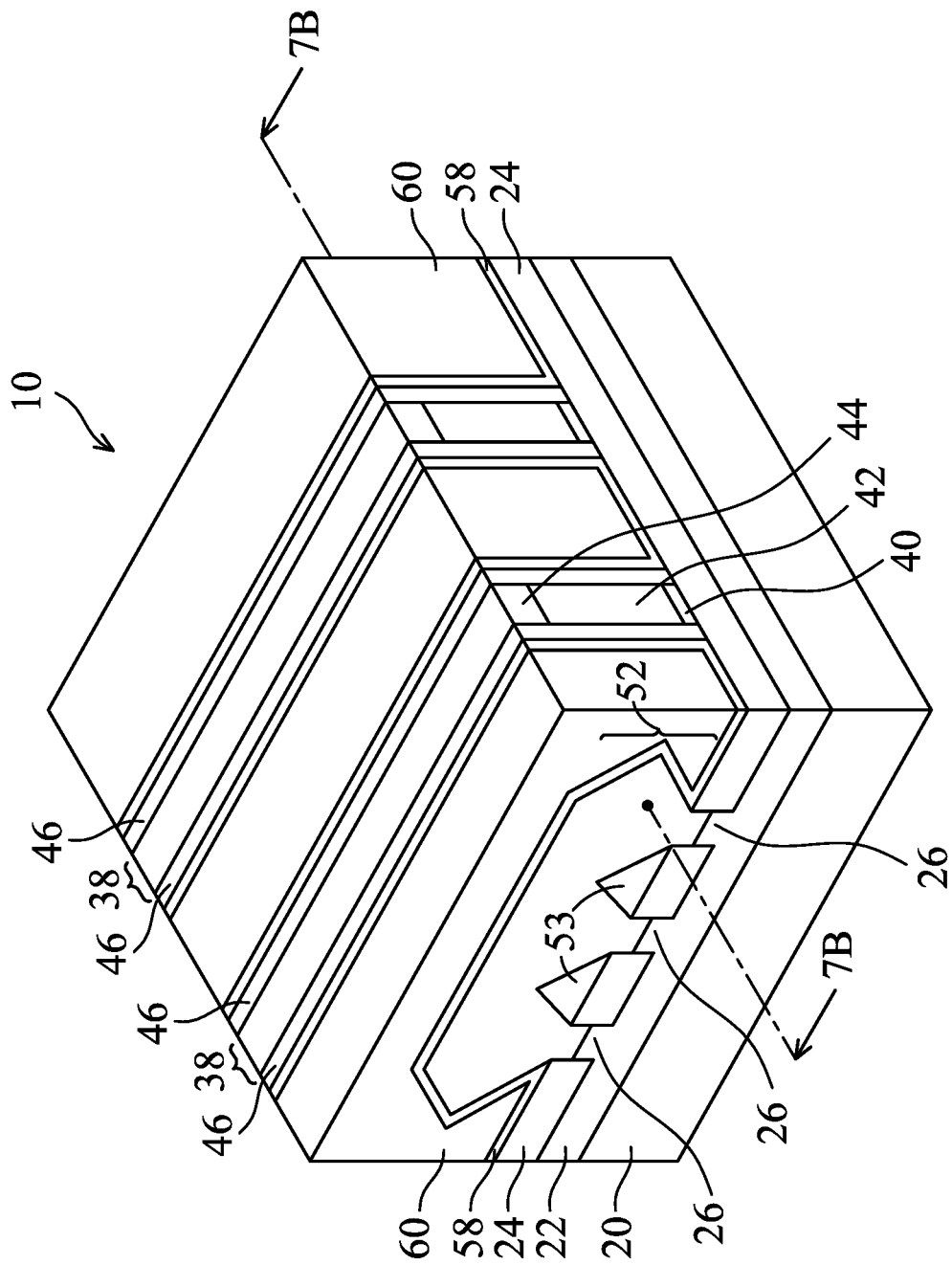

FIG. 7A illustrates a perspective view of the structure after the formation of Contact Etch Stop Layer (CESL) 58 and Inter-Layer Dielectric (ILD) 60. The respective process is illustrated as process 414 in the process flow 400 as shown in FIG. 22. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
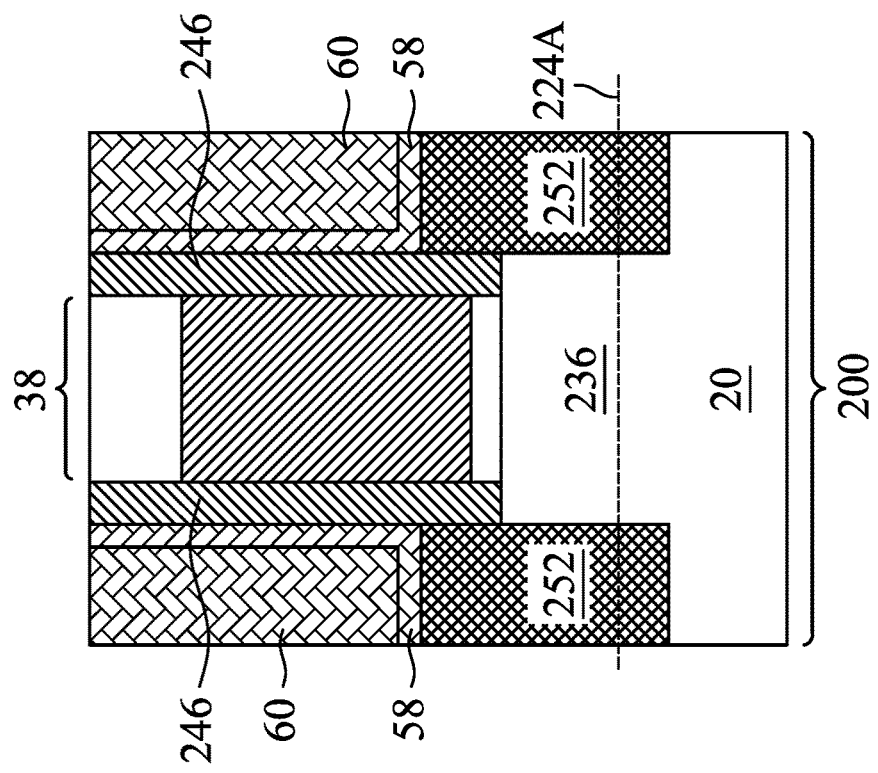
Figure 7B:
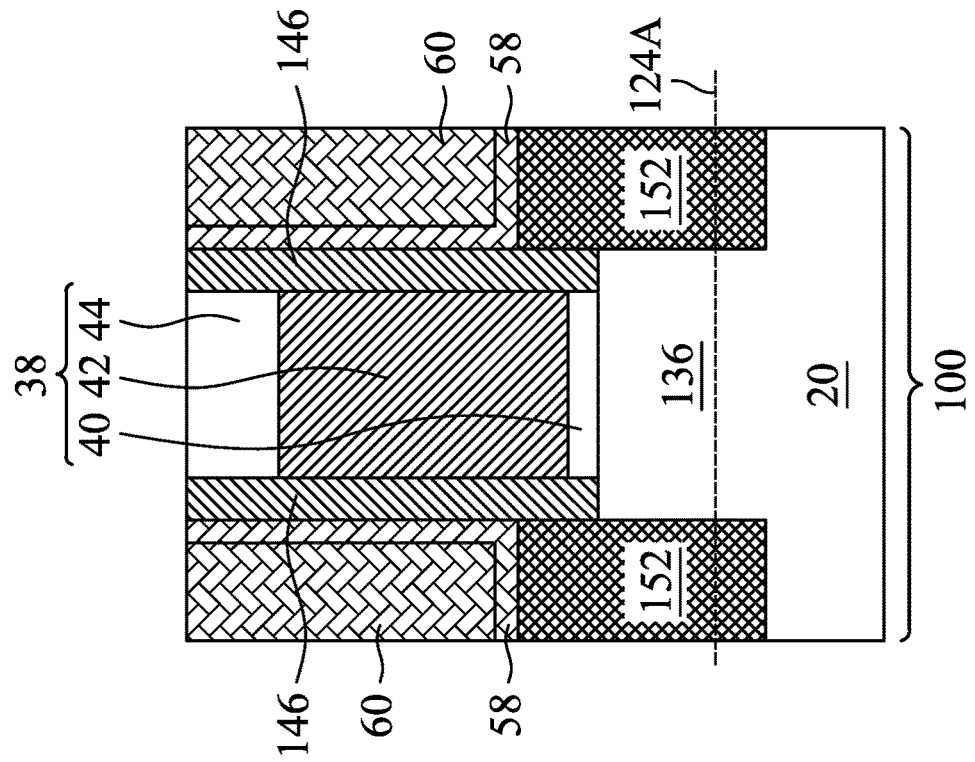

FIG. 7B illustrates the cross-sectional views of an intermediate structure in the formation of a first FinFET and a second FinFET on the same substrate 20, and in the same die and the same wafer. Either one of the First FinFET and the second FinFET may correspond to the cross-sectional view obtained from the vertical plane containing line 7B-7B in FIG. 7A. The first FinFET is formed in device region 100, and the second FinFET is formed in device region 200. The threshold voltages of the first FinFET and the second FinFET may be different for each other. In accordance with some embodiments of the present disclosure, both the first FinFET and the second FinFET are n-type FinFETs or p-type FinFETs. In accordance with alternative embodiments of the present disclosure, the first FinFET is an n-type FinFET, and the second FinFET is a p-type FinFET. Alternatively, the first FinFET is a p-type FinFET, and the second FinFET is an n-type FinFET. In the discussed example, the formation of an n-type FinFET and a p-type FinFET are illustrated, while other combinations of FinFETs are also contemplated.

To distinguish the features in the First FinFET from the features in the second FinFET, the features in the First FinFET may be represented using the reference numerals of the corresponding features in FIG. 7A plus number 100, and the features in the second FinFET may be represented using the reference numerals of the corresponding features in FIG. 7A plus number 200. For example, the source/drain regions 152 and 252 in FIG. 7B correspond to source/drain region 52 in FIG. 7A, and gate spacers 146 and 246 in FIG. 7B correspond to the gate spacers 46 in FIG. 7A. The corresponding features in the First FinFET and the second FinFET may be formed in common processes.

After the structure shown in FIGS. 7A and 7B is formed, the dummy gate stacks including hard mask layers 44, dummy gate electrodes 42, and dummy gate dielectrics 40 are replaced with metal gates and replacement gate dielectrics, as shown by the processes shown in FIGS. 8 through 16. In FIGS. 8 through 16, the top surfaces 124A and 224A of STI regions 24 are illustrated, and semiconductor fins 136 and 236 protrude higher than top surfaces 124A and 224A, respectively.

Figure 8:
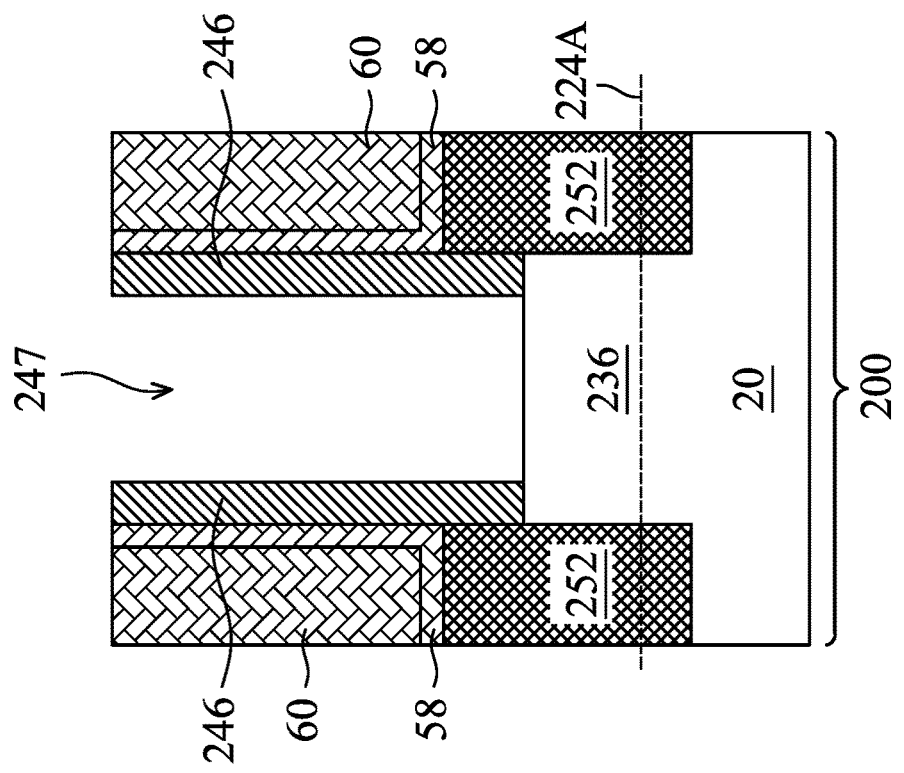
Figure 8:
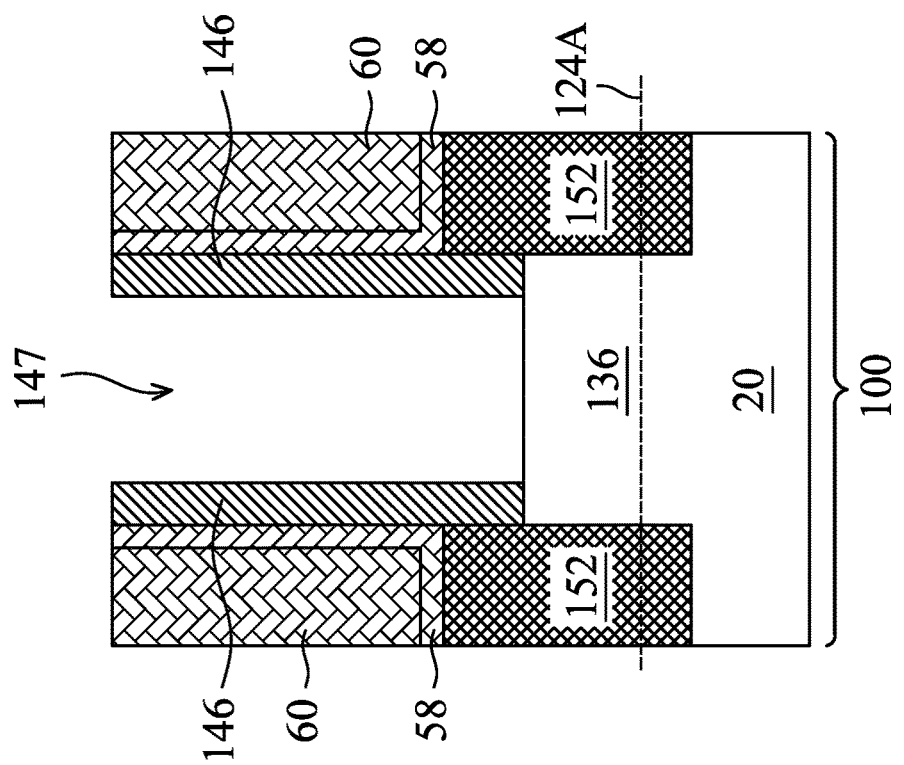

To form the replacement gates, hard mask layers 44, dummy gate electrodes 42, and dummy gate dielectrics 40 as shown in FIGS. 7A and 7B are removed, forming openings 147 and 247 as shown in FIG. 8. The respective process is illustrated as process 416 in the process flow 400 as shown in FIG. 22. The top surfaces and the sidewalls of protruding fins 136 and 236 are exposed to openings 147 and 247, respectively.

Figure 9:
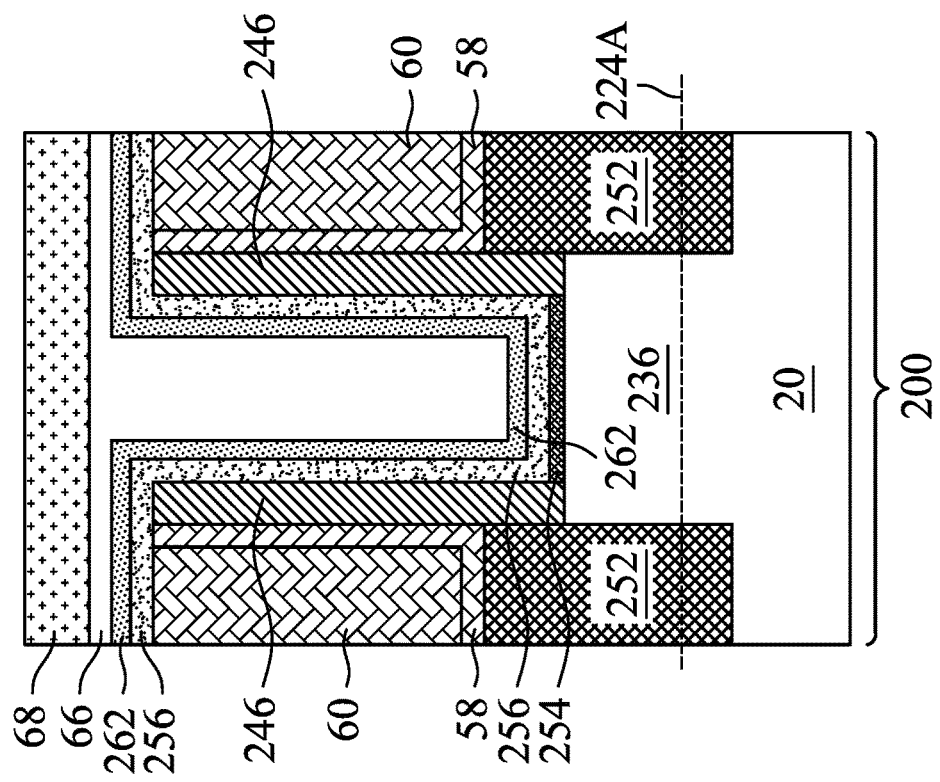
Figure 9:
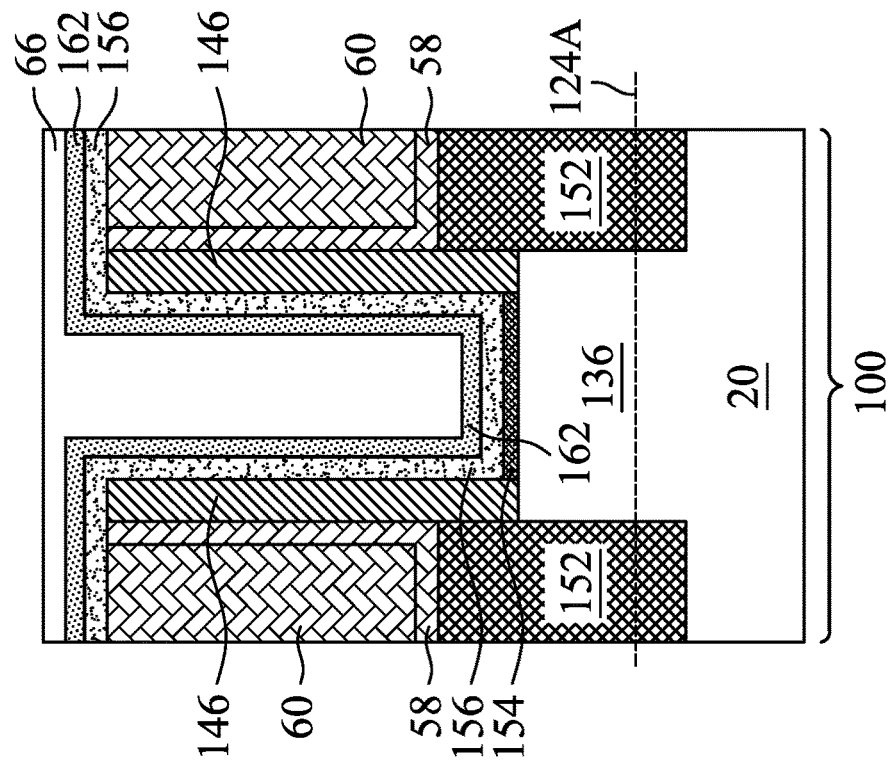

Next, referring to FIG. 9, gate dielectrics 154/156 and 254/256 are formed, which extend into openings 147 and 247, respectively. The respective process is illustrated as process 418 in the process flow 400 as shown in FIG. 22. In accordance with some embodiments of the present disclosure, the gate dielectrics include Interfacial Layers (ILs) 154 and 254, which are formed on the exposed surfaces of protruding fins 136 and 236, respectively. ILs 154 and 254 may include oxide layers such as silicon oxide layers, which are formed through the thermal oxidation of protruding fins 136 and 236, a chemical oxidation process, or a deposition process. The gate dielectrics may also include high-k dielectric layers 156 and 256 over the corresponding ILs 154 and 254. High-k dielectric layers 156 and 256 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layers 156 and 256 are overlying, and may contact, the respective underlying ILs 154 and 254. High-k dielectric layers 156 and 256 are formed as conformal layers, and extend on the sidewalls of protruding fins 136 and 236 and the top surfaces and the sidewalls of gate spacers 146 and 246, respectively. In accordance with some embodiments of the present disclosure, high-k dielectric layers 156 and 256 are formed using ALD or CVD.

Further referring to FIG. 9, a metal layer is formed. The respective process is illustrated as process 420 in the process flow 400 as shown in FIG. 22. The metal layer includes portion 162 in device region 100, and portion 262 in device region 200, and portions 162 and 262 are referred to as metal-containing layers. Metal-containing layers 162 and 262 are formed through deposition. The deposition may be performed using a conformal deposition method such as ALD or CVD, so that the horizontal thickness of the horizontal portions and vertical thickness of the vertical portions of metal-containing layer 262 (and each of sub-layers) are substantially equal to each other. For example, horizontal thickness T1 and vertical thickness T2 may have a difference smaller than about 20 percent or 10 percent of either of thicknesses T1 and T2. In accordance with some embodiments of the present disclosure, metal-containing layers 162 and 262 extend into openings 147 and 247 (FIG. 8), and include some portions over ILD 60.

Metal-containing layers 162 and 262 may include a p-type work-function metal layer such as a TiN layer. In accordance with some embodiments of the present disclosure, each of metal-containing layers 162 and 262 is a single layer such as a TiN layer. In accordance with other embodiments, each of metal-containing layers 162 and 262 is a composite layer including a plurality of layers formed of different materials. For example, each of metal-containing layers 162 and 262 may include a TiN layer, a TaN layer, and another TiN layer, respectively.

Bottom Anti-Reflective Coating (BARC) 66 is formed on metal-containing layers 162 and 262. The respective process is illustrated as process 422 in the process flow 400 as shown in FIG. 22. In accordance with some embodiments of the present disclosure, BARC 66 is formed of a photo resist, which is baked and hence cross-linked. Next, photo resist 68 is applied and patterned, so that the portion of photo resist 68 in device region 100 is removed, and the portion of photo resist 68 in device region 200 remains. The respective process is illustrated as process 424 in the process flow 400 as shown in FIG. 22.

Figure 10:
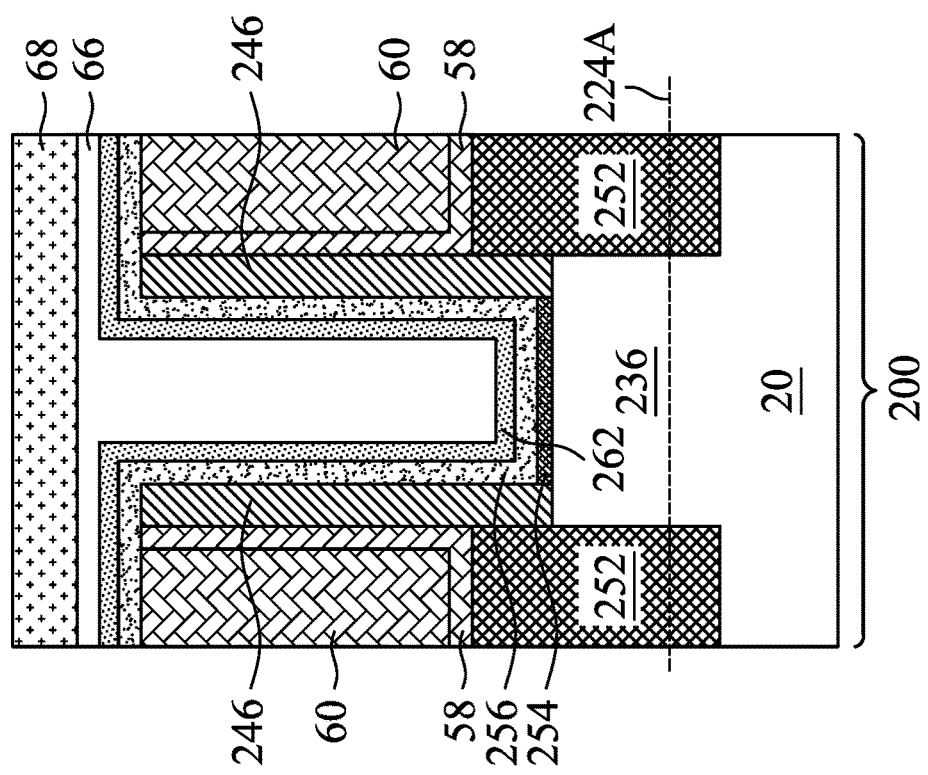
Figure 10:
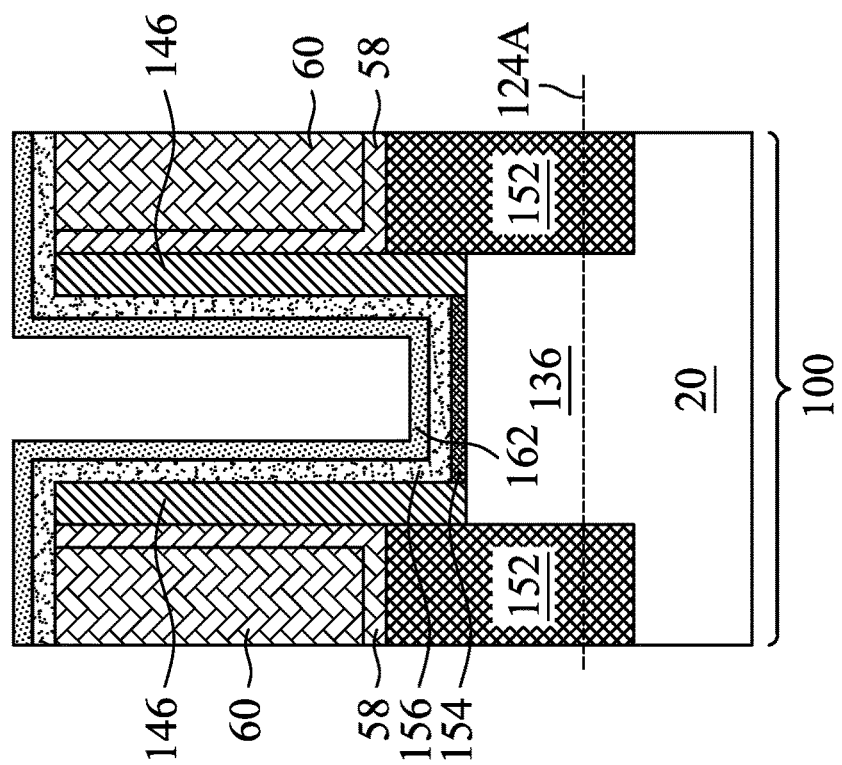
Figure 11:
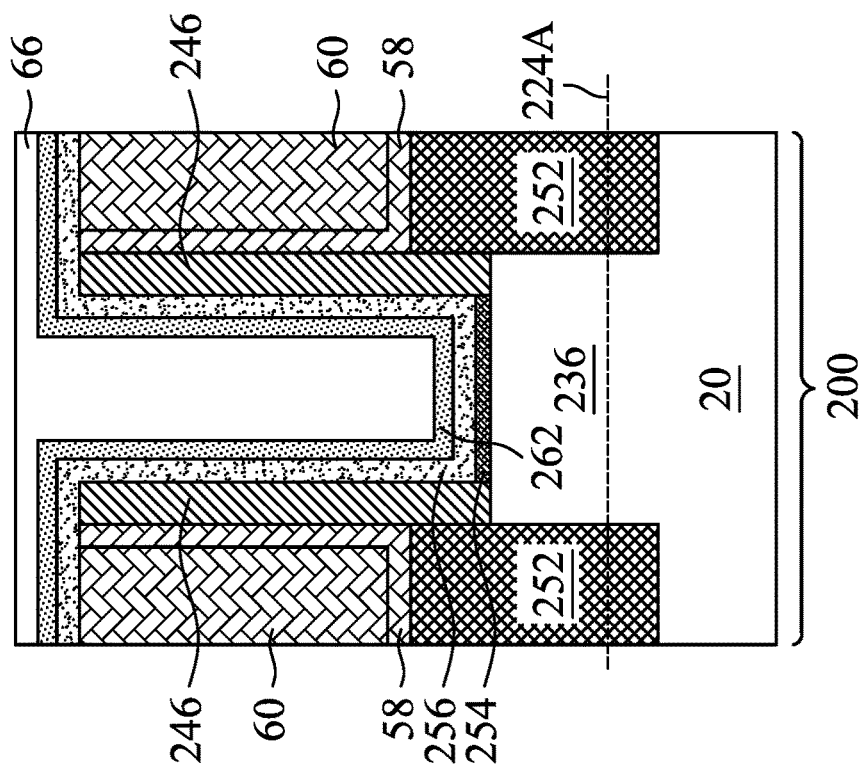
Figure 11:
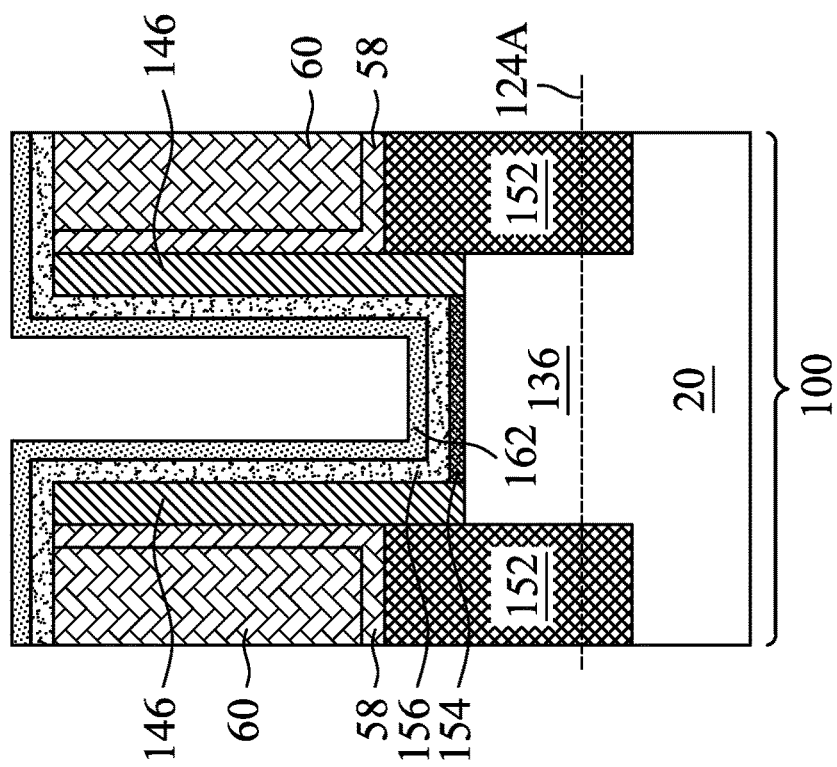

FIG. 10 illustrates an etching process, in which photo resist 68 is used as the etching mask. The portion of BARC 66 in device region 100 is removed in the etching process. The respective process is illustrated as process 426 in the process flow 400 as shown in FIG. 22. In a subsequent process, as shown in FIG. 11, photo resist 68 is removed, and the underlying BARC 66 is revealed.

Figure 12:
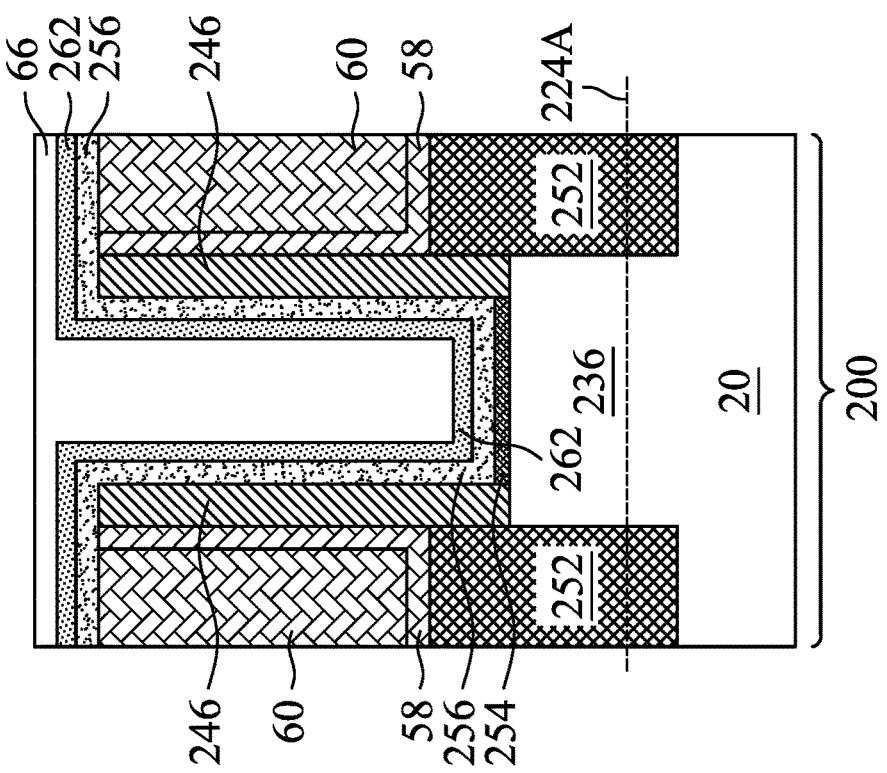
Figure 12:
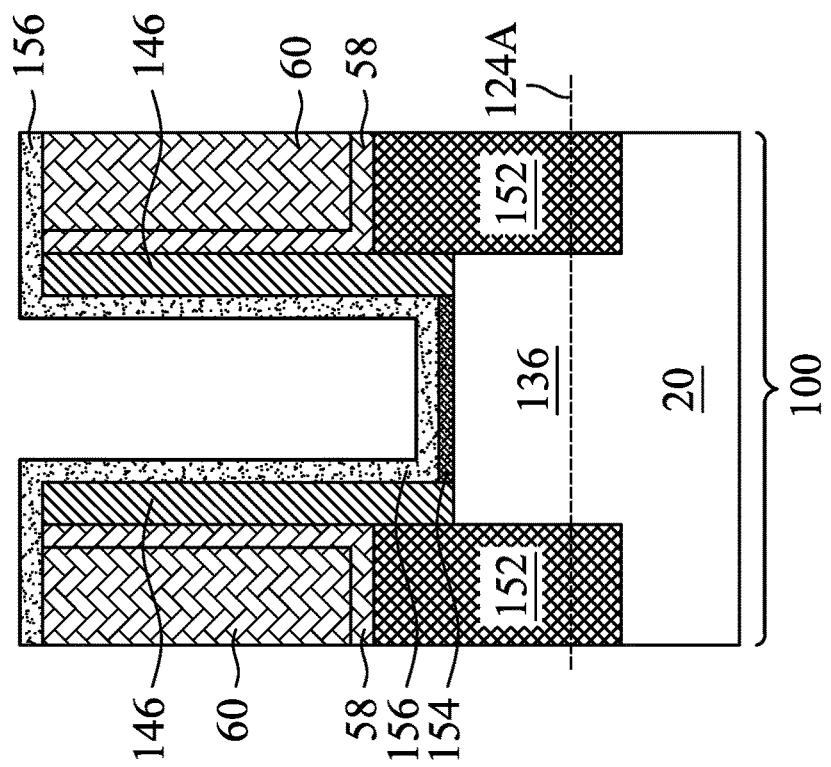

An etching process is then performed to etch metal-containing layer 162. The respective process is illustrated as process 428 in the process flow 400 as shown in FIG. 22. As a result, high-k dielectric layer 156 is revealed. The resulting structure is shown in FIG. 12. BARC 66 is used as an etching mask to protect metal-containing layer 262 during the etching process. In accordance with some embodiments of the present disclosure, the etching process is performed through wet etching. For example, when metal-containing layer 162 is formed of TiN, the etching chemical may include a chemical solution including ammonia ($NH_3$), hydrogen peroxide ($H_2O_2$), and water. In accordance with alternative embodiments, a dry etching process may be used.

Figure 13:
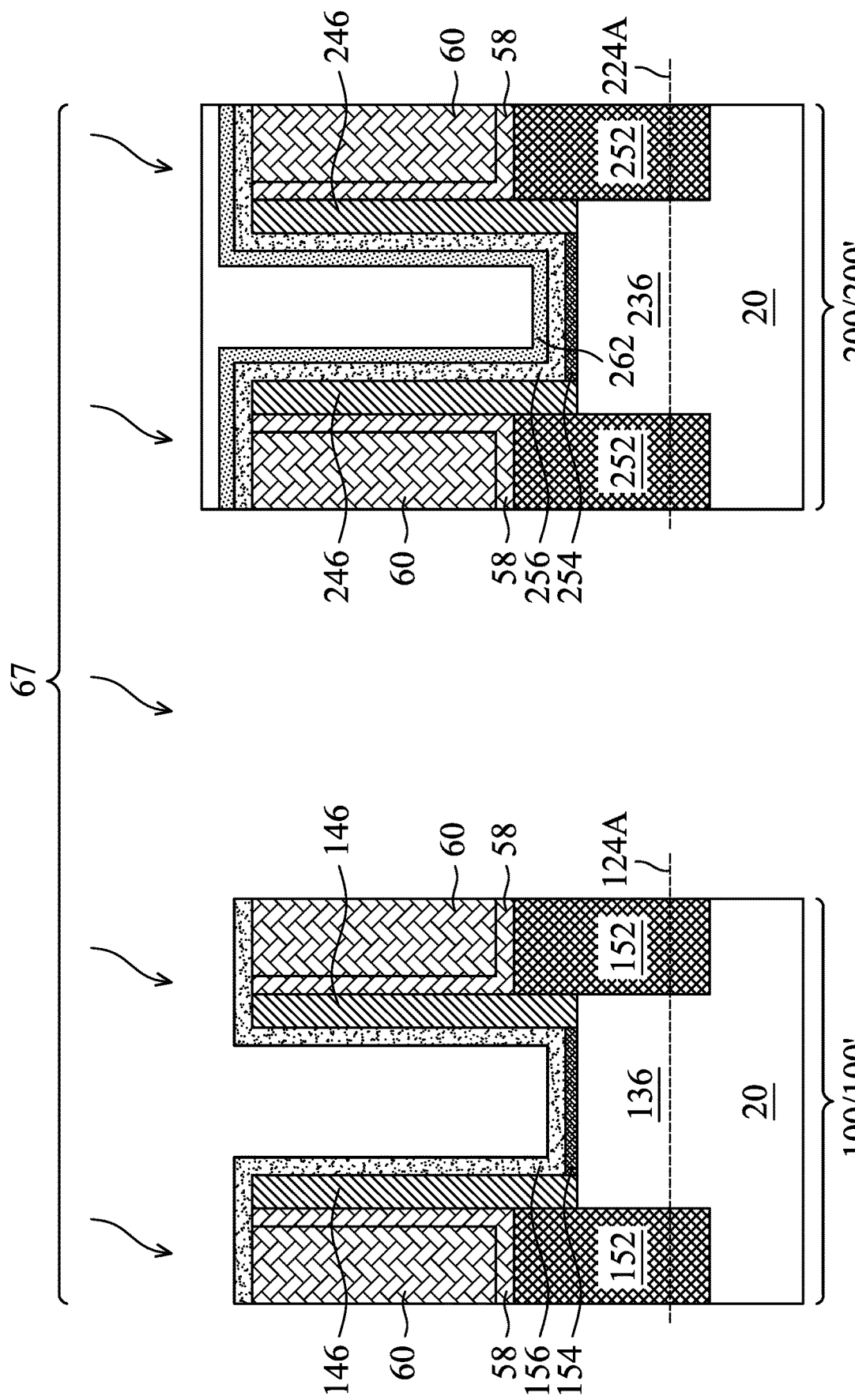
Figure 17:
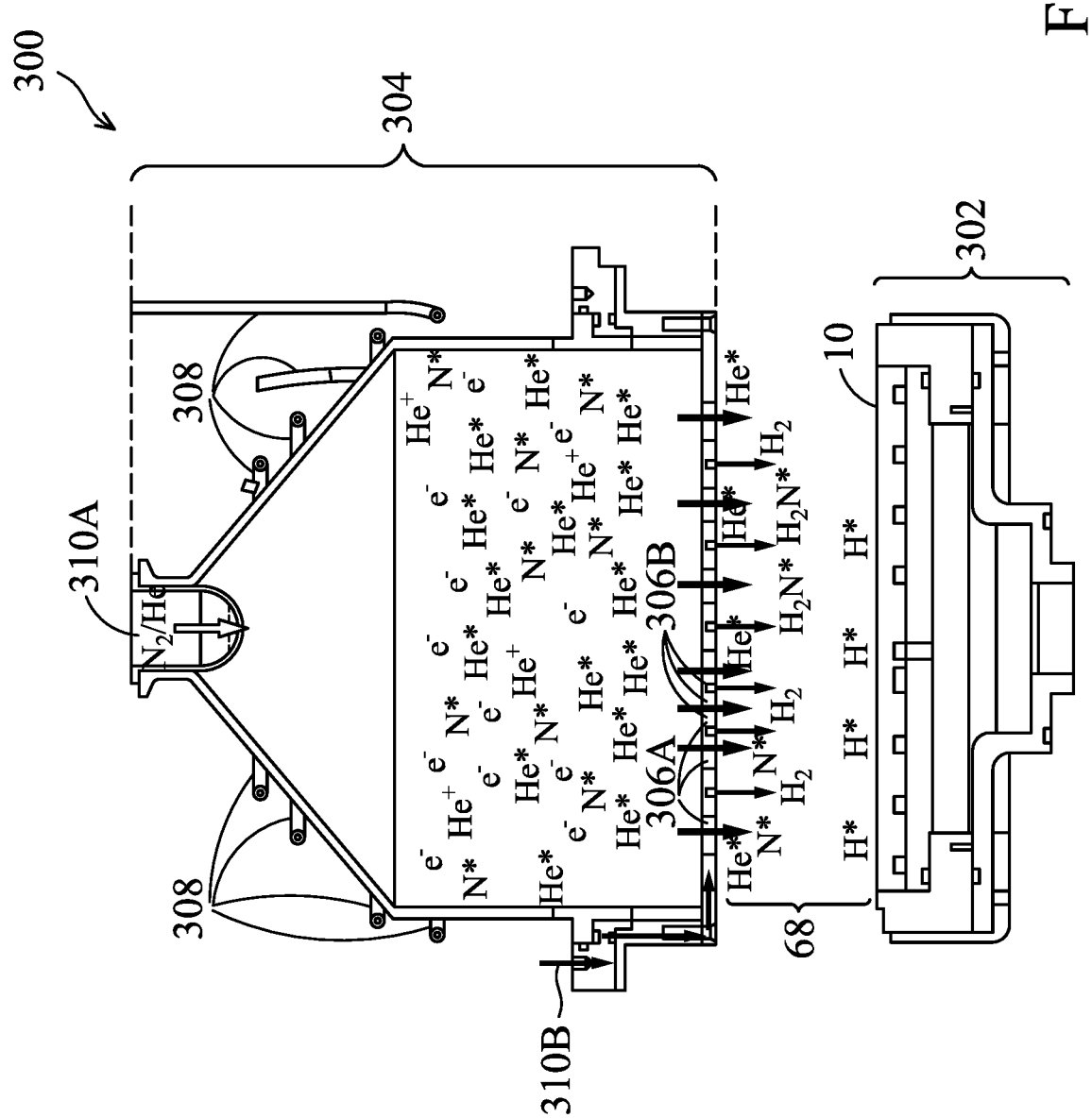
FIG. 17 illustrates a production tool and a treatment process for ashing and simultaneously adjusting threshold voltages of FinFETs in accordance with some embodiments.

FIG. 13 illustrates the removal of BARC 66 through an ashing process, in which plasma is generated, which is represented by arrows 67. The respective process is illustrated as process 430 in the process flow 400 as shown in FIG. 22. A production tool 300 used for the ashing of BARC 66 is shown in FIG. 17. Production tool 300 is configured to generate plasma, for example, through Inductively Coupled Plasma (ICP). Furthermore, Wafer 10 is placed over a wafer holder 302, which may be an electric Chuck (E-Chuck). Shower head 304 is located over wafer 10, in which plasma is generated from process gases. The plasma includes ions and radicals, which are filtered by shower head 304, so that radicals pass through holes 306A in shower head 304 to reach wafer 10, and ions are blocked, and are not able to pass through holes 306A.

Production tool 300 is configured to generate meta stable plasma, which have lifetime longer than typical plasma. Metastable state is an excited state of an atom or other system with a longer lifetime than the other excited states. For example, the atoms and radicals in the metastable state may remain excited for a considerable time in the order of about 1 second. However, the metastable state has a shorter lifetime than the stable ground state. The meta stable state is generated by conducting helium (He) gas and $N_2$ gas into shower head 304, and plasma is generated from He to generate He* radical.

As shown in FIG. 17, shower head 304 is a dual plenum shower head, which includes two inputs 310A and 310B. The first input 310A may be at the top of the shower head 304. In accordance with some embodiments, the mixed gases $N_2$ and He are conducted into an inner chamber of shower head 304 through input 310A, and hence the ions $N^+$ and $He^+$, electrons $e^-$, and radicals N* and He* are generated, for example, by coil 308. The inner chamber is connected to holes 306A, which are configured to trap the ions $N^+$ and $He^+$ and allows the radicals N* and He* to pass through.

The second input 310B may be at on the sides of the shower head 304, and the second input 310B is not connected to the inner chamber. In accordance with some embodiments, hydrogen ($H_2$) is conducted into shower head 304 through input 310B. The second input 310B is connected to holes 306B, which are facing wafer 10. Accordingly, the $H_2$ gas bypasses coil 308, and is not excited by the coils 308. Accordingly, the $H_2$ has a low energy.

Further referring to FIG. 17, when $H_2$ is conducted through the tunnels inside the sidewalls of shower head 304 to output from holes 306B, the $H_2$ gas, meeting He* and N* radicals, are excited, and hence H* radicals are generated. Since the H* receives energy from He* and N* radicals rather than directly from the coil 308, the energy state of H* is low. The low energy state of the resulting H* makes it possible to adjust the type and the amount of the trapped charges in high-k dielectric layer 156 (FIG. 13). The trapped charges affect the flat-band voltage (and the threshold voltage) of the resulting FinFET in device region 100.

As a result of exposing high-k dielectric layer 156 to the meta stable plasma, the ions and molecules such as N+ and NH−, etc., which are generated in the plasma, are trapped in high-k dielectric layer 156, and hence the corresponding charges are trapped in high-k dielectric layer 156. The trapping of the charges result in the change and the adjustment of the threshold voltage of FinFET in device region 100, which is revealed by FIG. 18.

Figure 18:
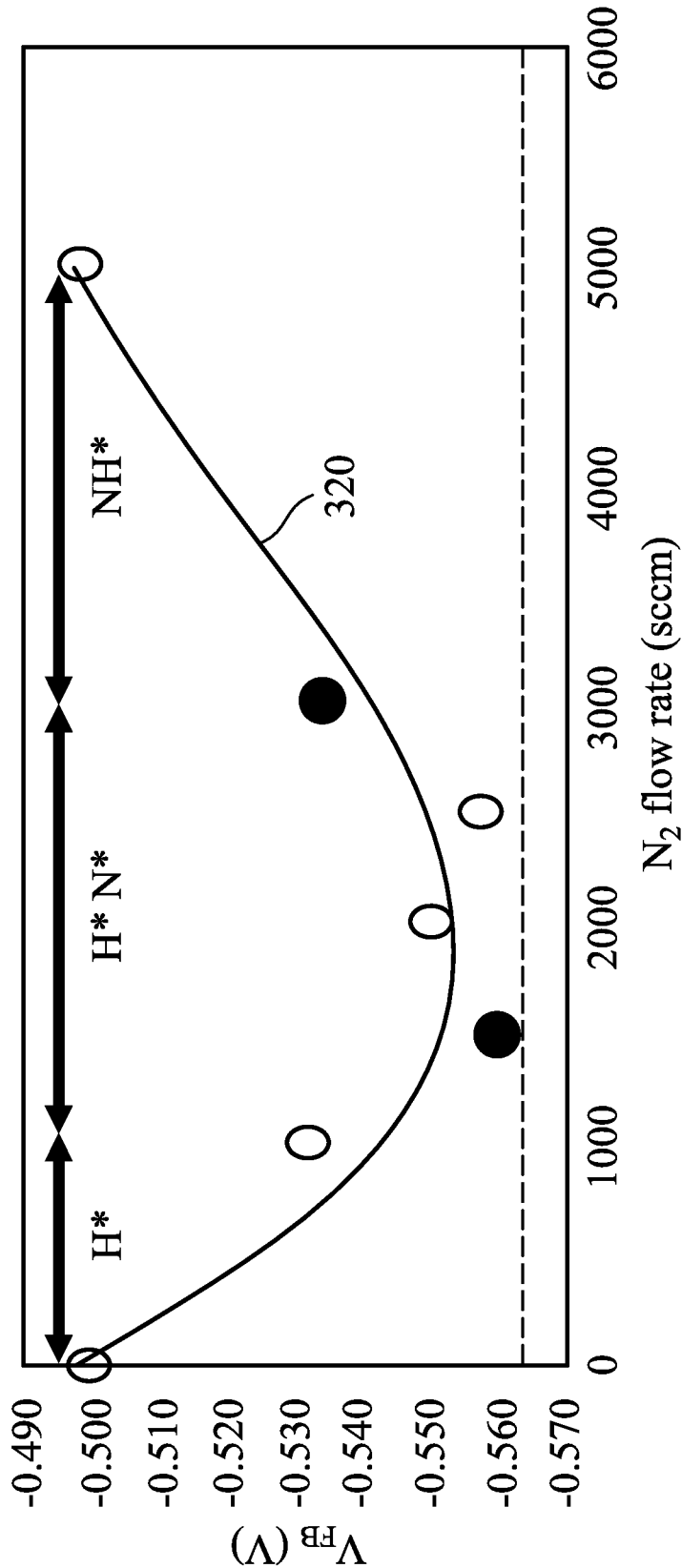
FIG. 18 illustrates flat-band voltages as a function of the flow rates of nitrogen in accordance with some embodiments.

FIG. 18 illustrates experiment results, wherein flat-band voltages are illustrated as a function of flow rates of $N_2$. The flat-band voltages are obtained from MOS capacitors (MOSCAPs), whose gates include high-k gate dielectrics that are treated using meta stable plasma, which is discussed referring to FIG. 17. The X-axis represents the flow rates of $N_2$, and the Y-axis represents the flat-band voltages of the MOS capacitors. The results in FIG. 18 are obtained when the flow rate of $H_2$ is 4,000 sccm, and the flow rate of He is 1,000 sccm. Line 320 are the flat-band voltages obtained when different flow rates of $N_2$ are used for conducting the ashing process as in FIG. 13. Line 320 reveals that different flow rates of $N_2$ (in the ashing of BARC 66) results in the resulting MOSCAPs to have different flat-band voltages, which are closely associated with threshold voltages. Furthermore, higher flat-band voltages are associated with higher threshold voltages. Accordingly, line 320 also reveals that different flow rates of $N_2$ (in the ashing of BARC 66) results in the resulting FinFETs to have different threshold voltages.

As shown in FIG. 18, when the flow rate of $N_2$ is at a certain value, such as about 2,000 sccm, the corresponding flat-band voltage (hence the threshold voltage) is the lowest. When the flow rate of $N_2$ is increased or reduced, the flat-band voltages increase. This may be caused by the change in the amount of radicals H*, H*N*, and NH*, as shown in FIG. 18. In accordance with some embodiments of the present disclosure, the meta stable plasma treatment process uses a nitrogen flow rate smaller than about 10,000 sccm. Metastable type source can also produce by He, $N_2$, and/or $O_2$ as side injection gases.

Figure 14:
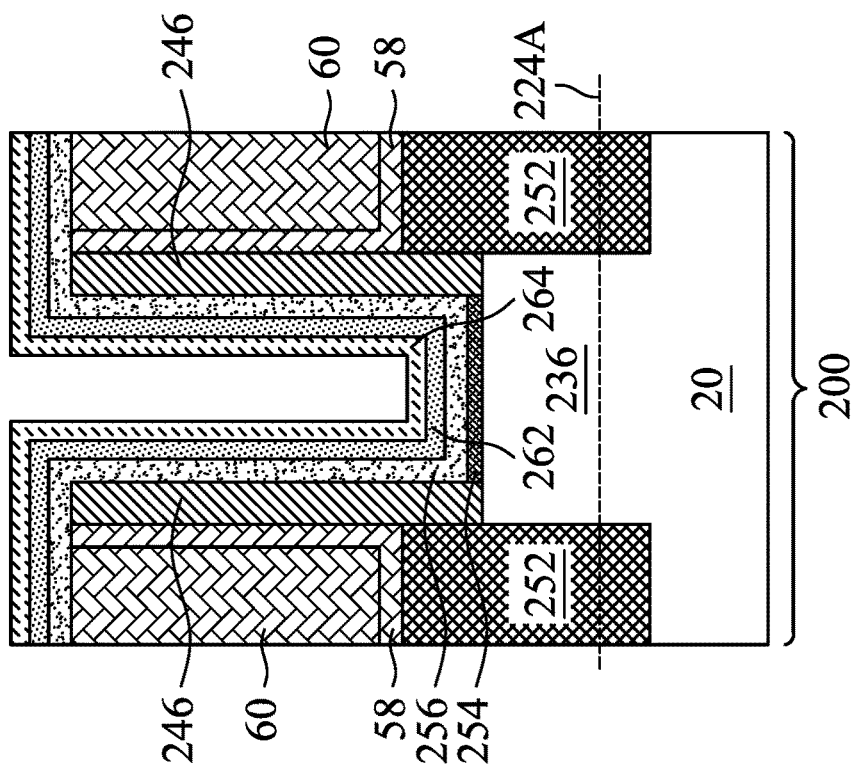
Figure 14:
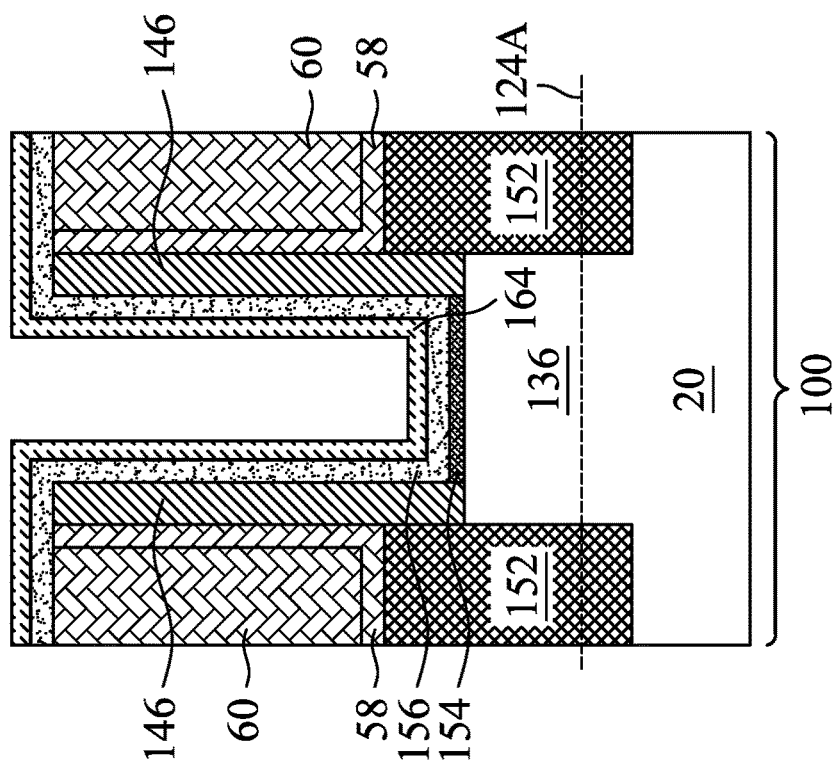

In accordance with some embodiments, the correlation between the threshold voltages and the flow rates of $N_2$ may be established. For example, a plurality of samples may be manufactured having, for example, the structure as shown in FIG. 14. Each of the samples goes through an ashing process (to remove BARC 66) using a certain flow rate of $N_2$, and the flow rates of $N_2$ for different samples are different from each other. The threshold voltages (and flat-band voltages) of the samples are measured/determined, so that the correlation between the threshold voltages and the corresponding flow rates of $N_2$ is established. In the manufacturing of FinFETs, when some FinFETs are intended to have certain threshold voltages, the corresponding flow rates of $N_2$ may be found from the correlation, and the corresponding flow rates of $N_2$ is adopted in the corresponding ashing processes to adjust its threshold voltage.

Figure 15:
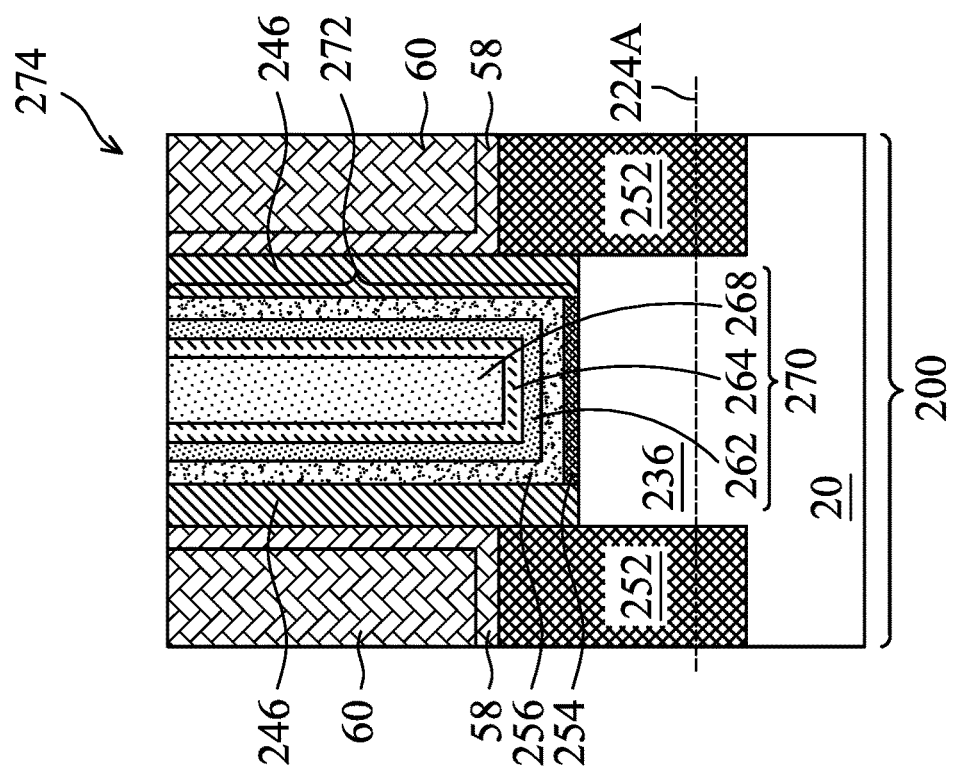
Figure 15:
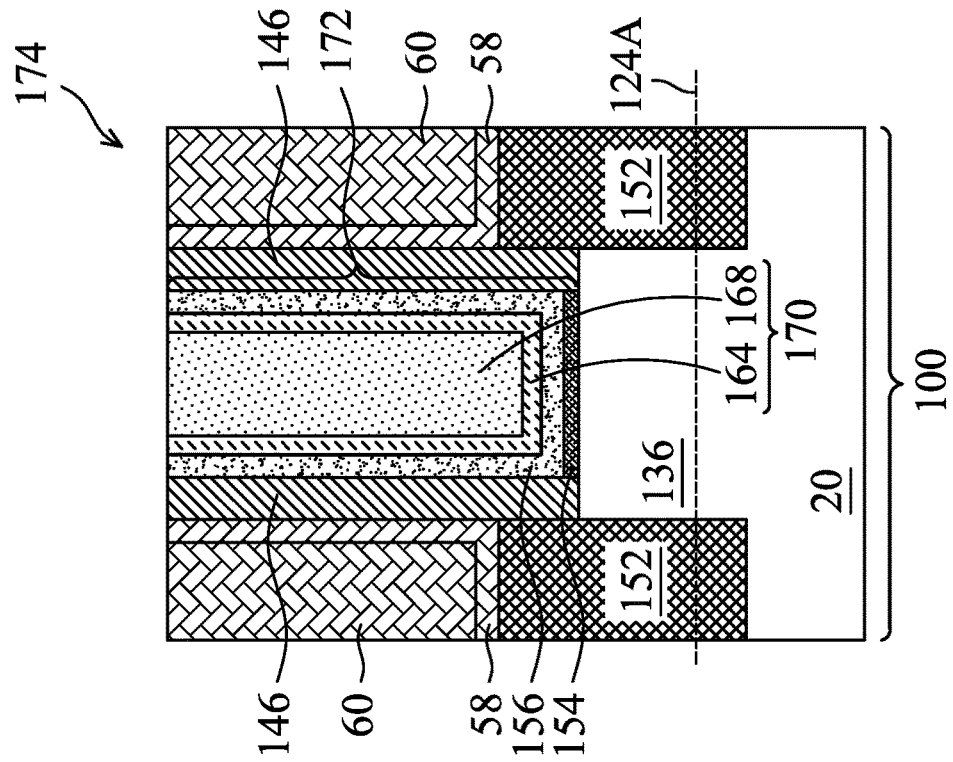
Figure 16:
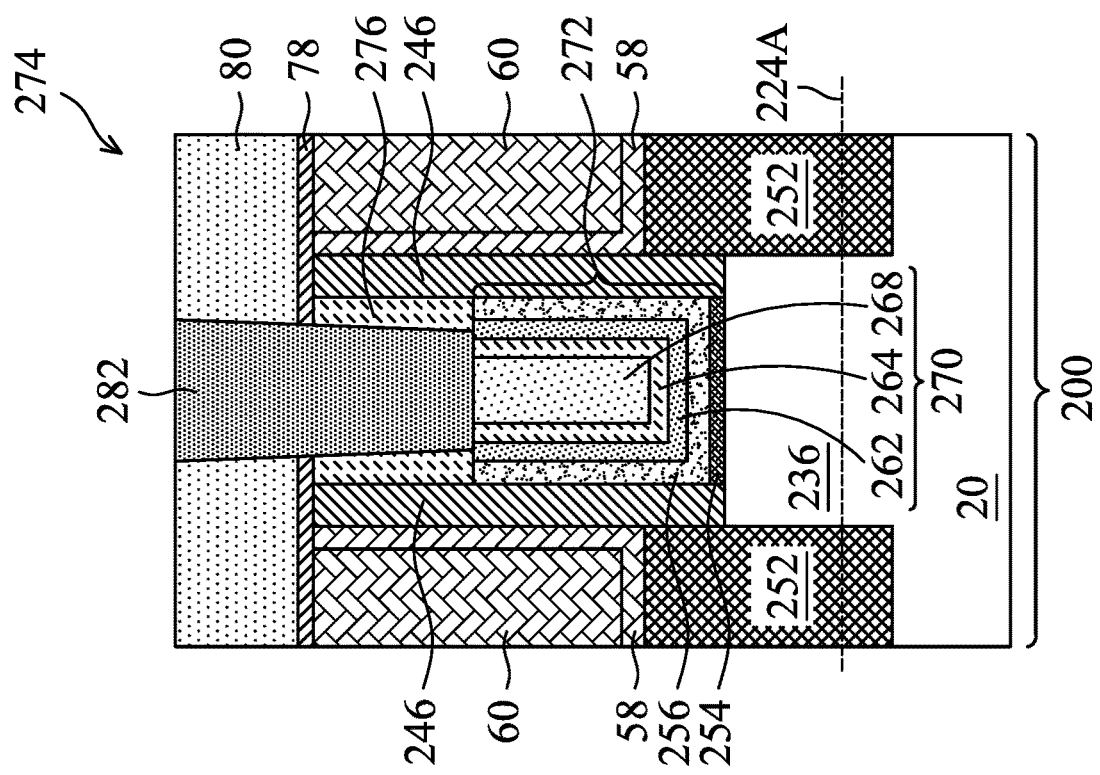
Figure 16:
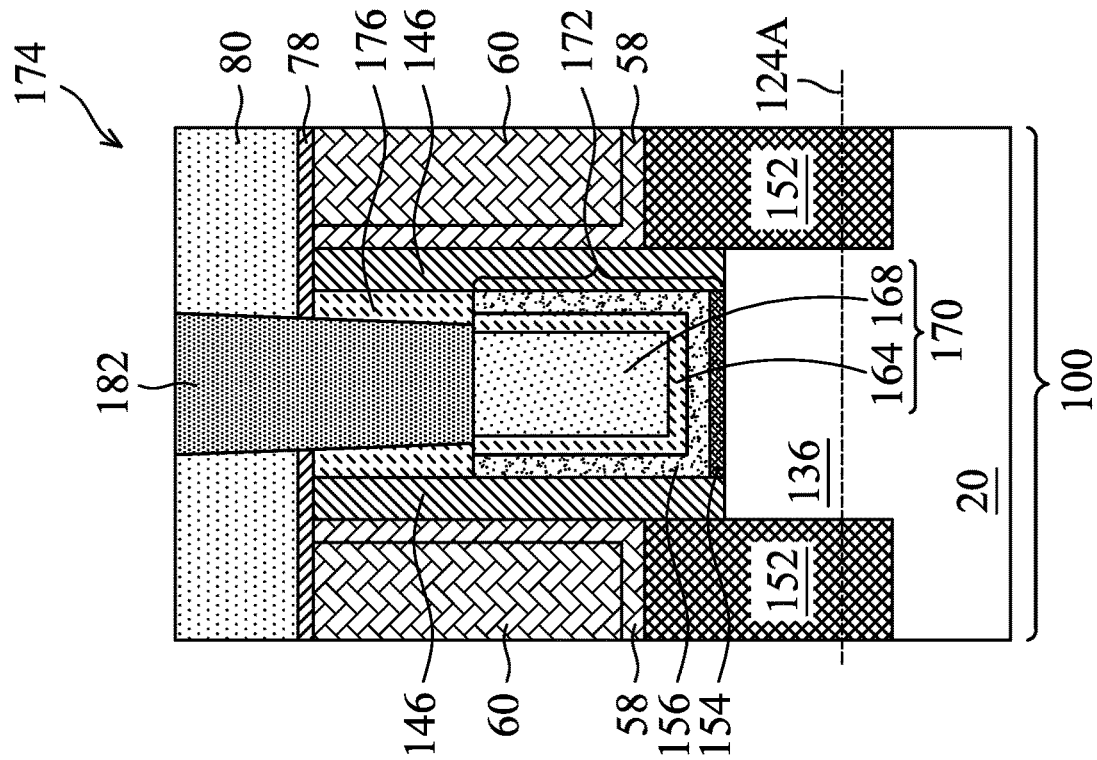

In addition, on a same device die, if two or more FinFETs (which may be n-type, p-type, or some are n-type and some are p-type) on a same die (same wafer) are intended to have different threshold voltages Vt, the difference in the threshold voltages Vt may be achieved by adopting different flow rates of $N_2$, while other structures and materials of the FinFETs may be identical to each other. For example, the two FinFETs may have identical work function metals with identical thicknesses. Furthermore, the two or more FinFETs may share same manufacturing processes, except that different flow rates of $N_2$ are adopted. In accordance with some embodiments, there are device regions 100' and 200' (schematically shown in FIG. 13) in addition to device regions 100 and 200. The features and the formation processes in the device region 100' are identical to device region 100, and the features and the formation processes in the device region 200' are identical to device region 200. The BARC 66 in device region 200 is ashed using a first $N_2$ flow rate, and the high-k dielectric layer 156 in device region 100 is exposed to the plasma generated using the first $N_2$ flow rate when the BARC 66 in device region 200 is ashed. The BARC 66 in device region 200' is ashed using a second $N_2$ flow rate different from the first $N_2$ flow rate, and the high-k dielectric layer 156 in device region 100' is exposed to the respective plasma. As a result, the FinFETs in device regions 100 and 100' have different threshold voltages, and the rest of the structures of the FinFETs in device regions 100 and 100' are identical. The rest of the processes (such as what are shown in FIGS. 14-16) in device regions 100 and 100' may be the same with each other, and share same processes. The rest of the processes (such as what are shown in FIGS. 14-16) in device regions 200 and 200' may be the same with each other, and share same processes.

Figure 19:
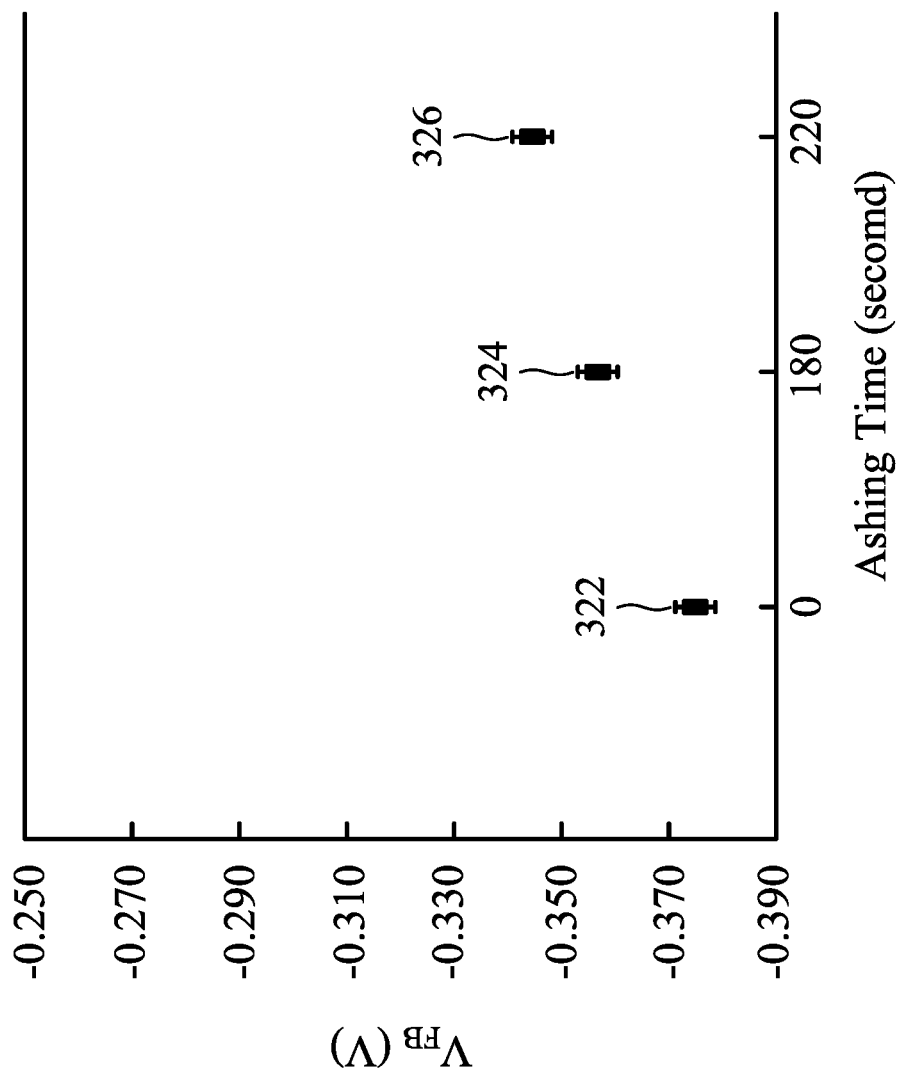
FIGS. 19 and 20 compare the effect on the flat-band voltages of FinFETs when convention Inductively Coupled Plasma (ICP) treatment and meta stable plasma treatment, respectively, are used in accordance with some embodiments.
Figure 20:
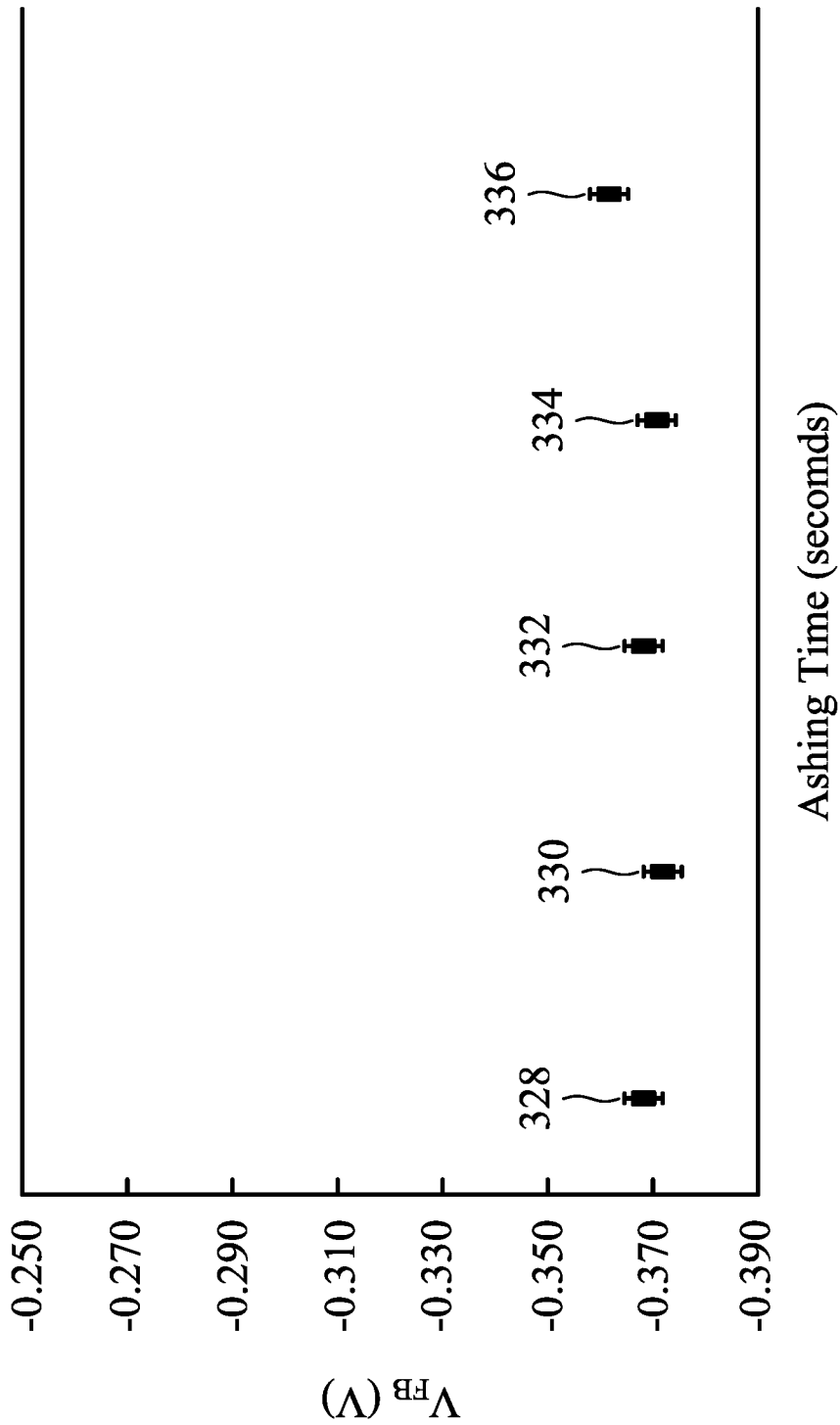

FIGS. 19 and 20 illustrate experiment results, which demonstrate the difference in the flat-band voltages of the device in device region 200 when convention ICP and meta stable plasma, respectively, are used for the ashing of BARC 66. Each of FIGS. 19 and 20 illustrates the flat-band voltages and the corresponding ashing duration. FIG. 19 is obtained when conventional ICP is used, in which $N_2$ and $H_2$ (with no He used) are provided from the input 310A in FIG. 17, hence the radicals have high energies. No gas is provided from input 310B. Data 322, 324, and 326 in FIG. 19 are obtained with the corresponding ashing duration being zero seconds (no ashing), 180 seconds, and 220 seconds, respectively. The data indicate that with the increase in the ashing time, the flat-band voltages increase, causing the increase in the threshold voltages of the devices in device region 200 (FIG. 13). This is undesirable since it is preferred that the threshold voltage of the device in device region 200 is not changed when the threshold voltage of the device in device region 100 is adjusted. The undesirable change in the threshold voltage of the device in device region 200 is due to the high energy of the radicals, hence metal-containing layer 262 and BARC 66 (FIG. 13) are unable to mask the effect of the radicals.

FIG. 20 is obtained when meta stable plasma according to the embodiments of the present disclosure is used. Data 328, 330, 332, 334, and 336 are obtained with the corresponding ashing duration increase. The data indicate that with the increase in the ashing time, the flat-band voltages remain substantially stable, and hence the threshold voltages of the devices in device region 200 (FIG. 13) is not changed. This allows the threshold voltages of the FinFETs in device region 100 to be adjusted independently without affecting the threshold voltages of the FinFETs in device region 200.

Figure 21:
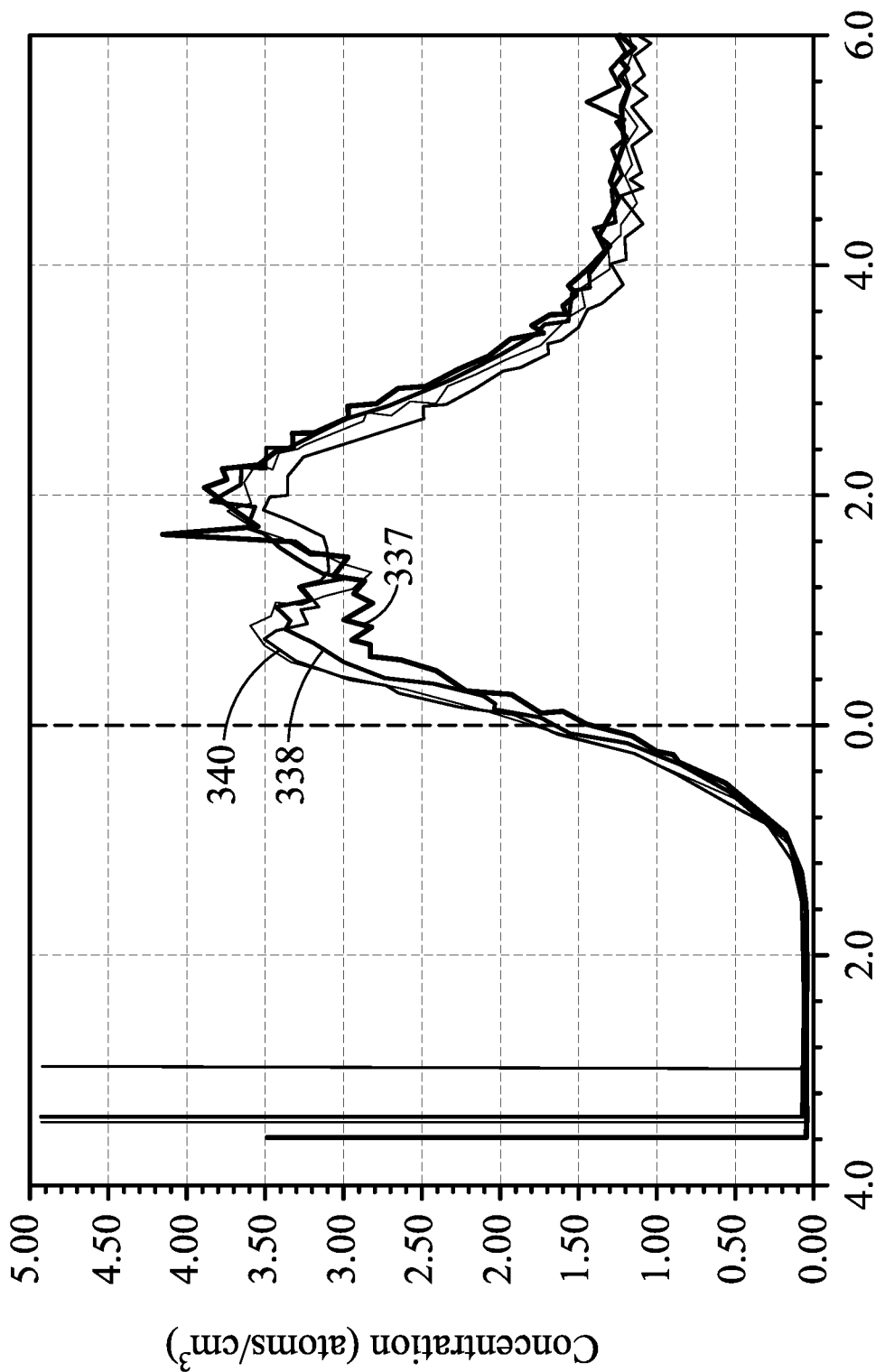
FIG. 21 illustrates the hydrogen concentrations in high-k dielectric layers treated by meta stable plasma with different nitrogen flow rates in accordance with some embodiments.

FIG. 21 illustrates the hydrogen concentrations in high-k dielectric layer 156 (FIG. 13) when different ashing conditions are used. The X-axis represents the depth into the respective samples, and the Y-axis represents the concentrations (atoms/cm$^3$). Lines 337, 338, and 340 represent the H− concentrations obtained when the $N_2$ flow rate is 3,000 sccm, 1,500 sccm, and 0 sccm (no ashing is performed), respectively. The results indicate that line 336 has a higher hydrogen concentrations than lines 338 and 340, indicating it corresponding to more H− trapped in high-k dielectric layer 156. This also indicates that the $N_2$ flow of 3,000 sccm corresponds to more negative charges (H⁻), and hence the corresponding transistor formed using 3,000 sccm $N_2$ ashing has a higher threshold voltage than the transistor exposed to the 1,500 sccm $N_2$ ashing. FIG. 21 also demonstrates that the threshold voltages of transistors may be adjusted by adjusting the flow rate of $N_2$.

The meta stable plasma ashing also helps reduce oxidation of TiN, which may be used to form metal-containing layer 262. X-ray Photoelectron Spectroscopy (XPS) analysis has been performed on TiN films, which have BARCs formed thereon, and the BARCs are ashed using either meta stable plasma or convention ICP plasma. It is observed that a sample undergoes a conventional ICP plasma ashing has Ti2P intensity values of 20.0 before the ashing process and 18.7 after the ashing process. Accordingly, the ICP plasma reduces the Ti2P value by 1.3. As a comparison, a sample undergoes meta stable plasma ashing has Ti2P intensity values of 19.6 before the ashing process and 19.1 after the ashing process, respectively. Accordingly, the meta stable plasma reduces the Ti2P value by 0.5, which is smaller than 1.3. This means that the meta stable plasma also results in less oxidation of the TiN (layer 262) when its overlying BARC 66 is ashed.

The hydrogen radicals as generated by the meta stable plasma are used to ash and remove BARC 66, as shown in FIGS. 13 and 14. FIG. 14 illustrates the structure after BARC 66 is ashed. At this time, metal-containing layer 262 provides protection to the underlying high-k dielectric layer 56 from receiving charges such as N⁺ and NH⁻, and prevents the adjustment of the threshold of the resulting FinFET.

As a result of the meta stable plasma ashing process that adopt $N_2$ as a process gas, nitrogen is trapped in high-k dielectric layer 156, for example, in the form of N⁺ and NH⁻. Accordingly, the meta stable plasma process may replace the conventional thermal nitridation processes performed on high-k dielectric layers, which uses ammonia as a process gas. Accordingly, in accordance with some embodiments of the present disclosure, no thermal nitridation processes using ammonia is performed on high-k dielectric layers throughout the formation of the FinFETs.

FIG. 15 illustrates the continued formation of the FinFETs. In accordance with some embodiments of the present disclosure, an n-type work function layer, which includes portion 164 in device region 100, and portion 264 in device region 200, is deposited. The respective process is illustrated as process 432 in the process flow 400 as shown in FIG. 22. In accordance with some embodiments, the n-type work function layers 164 and 264 include a single layer such as a TiAl layer. In accordance with other embodiments, each of the n-type work function layers 164 and 264 includes a composite layer including a TiN layer, a TaN layer, and an Al-based layer (formed of, for example, TiAlN, TiAlC, TaAlN, or TaAlC). A blocking layer and a filling metal are then deposited to form metal regions 168 and 268. The respective process is illustrated as process 434 in the process flow 400 as shown in FIG. 22. A planarization process such as a CMP process or a mechanical grinding process is then performed, forming metal gates 170 and 270. Replacement gate stacks 172 and 272, which include the corresponding gate electrodes 170 and 270 and the corresponding gate dielectrics 154/156 and 254/256 are also formed. FinFETs 174 and 274 are thus formed.

Referring to FIG. 16, gate electrodes 170 and 270 are recessed, and are filled with a dielectric material (such as SiN) to form hard masks 176 and 276. Etch stop layer 78 is formed over hard masks 176 and 276 and ILD 60. Etch stop layer 78 is formed of a dielectric material, which may include silicon carbide, silicon nitride, silicon oxynitride, or the like. ILD 80 is formed over etch stop layer 78, and gate contact plugs 182 and 282 are formed in ILD 80.

The embodiments of the present disclosure have some advantageous features. The etching mask for etching a metal layer formed on a high-k dielectric layer of a transistor is removed through ashing using meta stable plasma. The energy of the meta stable plasma is low. Accordingly, unlike the conventional ICP plasma ashing, in which the effect of adjusting threshold is saturated, the threshold voltage of the transistor can be adjusted by adjusting the flow rate of nitrogen. Also, the transistor whose metal layer is directly under the ashed mask is protected by the metal layer from being affected by the meta stable plasma, and hence the threshold voltage of the respective transistor is not affected by the ashing process.

In accordance with some embodiments of the present disclosure, a method comprises forming a first high-k dielectric layer over a first semiconductor region; forming a second high-k dielectric layer over a second semiconductor region; forming a first metal layer comprising a first portion over the first high-k dielectric layer and a second portion over the second high-k dielectric layer; forming an etching mask over the second portion of the first metal layer; etching the first portion of the first metal layer, wherein the etching mask protects the second portion of the first metal layer; ashing the etching mask using meta stable plasma; and forming a second metal layer over the first high-k dielectric layer. In accordance with some embodiments, the method further comprises generating the meta stable plasma using nitrogen gas, hydrogen gas, and helium gas. In accordance with some embodiments, the nitrogen gas and the helium gas are input into a first input of a shower head, and the hydrogen gas is input into a second input of the shower head to mix with radicals generated from the nitrogen gas and the helium gas. In accordance with some embodiments, when the etching mask is ashed, the first high-k dielectric layer is exposed to the meta stable plasma. In accordance with some embodiments, the first high-k dielectric layer is not thermally nitridated. In accordance with some embodiments, the first metal layer is a p work-function layer, and the second metal layer is an n-type work-function layer.

In accordance with some embodiments of the present disclosure, a method comprises forming a metal layer over a high-k dielectric layer; forming a Bottom BARC over the metal layer; forming a photo resist over the BARC; patterning the photo resist; etching the BARC using the patterned photo resist as an etching mask; and removing the BARC using meta stable plasma, wherein the meta stable plasma is generated by processes comprising: conducting nitrogen and helium into a first input of a shower head to generate a plasma; filtering to remove ions from the plasma, with nitrogen radicals and helium radicals left in the plasma; and conducting hydrogen into a second input of the shower head, wherein hydrogen is mixed with the nitrogen radicals and helium radicals. In accordance with some embodiments, the method further comprises exposing a high-k dielectric layer to the meta stable plasma. In accordance with some embodiments, the method further comprises forming source and drain regions on opposite sides of the high-k dielectric layer; and depositing a work function layer on the high-k dielectric layer. In accordance with some embodiments, the forming the metal layer comprises forming an n-type work function layer. In accordance with some embodiments, the forming the metal layer comprises forming a p-type work function layer. In accordance with some embodiments, when the nitrogen and helium are conducted into the first input of the shower head to generate the plasma, the hydrogen is not passed through coils surrounding the shower head. In accordance with some embodiments, the method further comprises forming a plurality of transistors comprising forming a plurality of high-k dielectric layers, wherein the plurality of high-k dielectric layers are formed of a same high-k dielectric material; performing a plurality of treatment processes using meta stable plasma, with nitrogen, hydrogen, and helium being used as process gases, wherein each of the plurality of treatment processes is performed on one of the plurality of high-k dielectric layers, and nitrogen flow rates in the plurality of treatment processes are different from each other; and determining threshold voltages of the plurality of transistors to establish a correlation between nitrogen flow rates and the threshold voltages. In accordance with some embodiments, hydrogen flow rates in the plurality of treatment processes are same as each other, and helium flow rates in the plurality of treatment processes are same as each other.

In accordance with some embodiments of the present disclosure, a method comprises forming a first high-k dielectric layer and a second high-k dielectric layer on a wafer, wherein the first high-k dielectric layer and the second high-k dielectric layer are formed of a same high-k dielectric material; performing a first treatment process on the first high-k dielectric layer using a first meta stable plasma process, with nitrogen, hydrogen, and helium being used as process gases, and the nitrogen having a first flow rate; performing a second treatment process on the second high-k dielectric layer using a second meta stable plasma process, with nitrogen, hydrogen, and helium being used as process gases, and the nitrogen having a second flow rate; and forming a first metal layer and a second metal layer over the first high-k dielectric layer and the second high-k dielectric layer, respectively. In accordance with some embodiments, hydrogen flow rates in the first treatment process and the second treatment process are same as each other, and helium flow rates in the first treatment process and the second treatment process are same as each other. In accordance with some embodiments, the first high-k dielectric layer and the second high-k dielectric layer are in a same die of the wafer. In accordance with some embodiments, the first high-k dielectric layer and the second high-k dielectric layer are parts of n-type transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first high-k dielectric layer in a first device region of a wafer;
    forming a second high-k dielectric layer in a second device region of the wafer;
    performing a first meta stable plasma treatment on the first high-k dielectric layer using nitrogen ($N_2$) with a first flow rate;
    performing a second meta stable plasma treatment on the second high-k dielectric layer using nitrogen ($N_2$) with a second flow rate different from the first flow rate;
    forming a first gate electrode over the first high-k dielectric layer; and
    forming a second gate electrode over the second high-k dielectric layer, wherein the first gate electrode and the second gate electrode are formed in a common formation process.

2. The method of claim 1, wherein the first high-k dielectric layer and the first gate electrode are in a first transistor, and the second high-k dielectric layer and the second gate electrode are in a second transistor, and wherein the first transistor and the second transistor have different threshold voltages.

3. The method of claim 2, wherein the first flow rate of nitrogen is higher than the second flow rate of nitrogen, and wherein the first transistor has a higher threshold voltage than the second transistor.

4. The method of claim 3 further comprising:
    forming a third high-k dielectric layer in a third device region of the wafer; and
    performing a third meta stable plasma treatment on the third high-k dielectric layer using nitrogen with a third flow rate, wherein the third flow rate of nitrogen is higher than the second flow rate of nitrogen, and wherein a third transistor comprising the third high-k dielectric layer has a higher threshold voltage than the second transistor.

5. The method of claim 1, wherein the first high-k dielectric layer and the second high-k dielectric layer are deposited in a common deposition process.

6. The method of claim 1, wherein the first meta stable plasma treatment and the second meta stable plasma treatment are performed using nitrogen, helium, and hydrogen as process gases.

7. The method of claim 6, wherein for each of the first meta stable plasma treatment and the second meta stable plasma treatment, the nitrogen and the helium are conducted to a first input of a shower head in a tool, and are output to the wafer through a first output of the shower head, and the hydrogen is conducted to a second input of the shower head, and is output to the wafer through a second output of the shower head.

8. The method of claim 6, wherein for each of the first meta stable plasma treatment and the second meta stable plasma treatment, the nitrogen and the helium are passed through a coil to generate plasma, and the hydrogen is conducted to the wafer without generating plasma.

9. The method of claim 1 further comprising, before the first meta stable plasma treatment is performed:
    forming a first metal layer over the first high-k dielectric layer, wherein the first metal layer comprises a first portion overlapping the first high-k dielectric layer; and
    removing the first portion of the first metal layer.

10. The method of claim 9, wherein the first metal layer further comprises a second portion deposited overlapping a third high-k dielectric layer, wherein at a time the first meta stable plasma treatment is performed, the second portion of the first metal layer covers the third high-k dielectric layer.

11. The method of claim 9, wherein the first gate electrode comprises a p-type work-function layer, and the second gate electrode comprises an n-type work-function layer.

12. The method of claim 1, wherein the first high-k dielectric layer is not thermally nitridated.

13. A method comprising:
adjusting a first threshold voltage of a first transistor, wherein the adjusting the first threshold voltage comprises performing a first treatment process on a first high-k dielectric layer using a first meta stable plasma, with nitrogen ($N_2$) and hydrogen ($H_2$) being used as process gases, and with the nitrogen having a first process flow;
adjusting a second threshold voltage of a second transistor to be different from the first threshold voltage, wherein the adjusting the second threshold voltage comprises performing a second treatment process on a second high-k dielectric layer using a second meta stable plasma, with nitrogen ($N_2$) and hydrogen ($H_2$) being used as process gases, and with the nitrogen having a second process flow different from the first process flow; and
depositing a first work function layer and a second work function layer over the first high-k dielectric layer and the second high-k dielectric layer, respectively.

14. The method of claim 13 further comprising, before the first treatment process:
depositing a metal layer over the first high-k dielectric layer; and
etching a first portion of the metal layer to reveal the first high-k dielectric layer.

15. The method of claim 14 further comprising:
dispensing a bottom anti-reflective coating comprising a portion overlapping a second portion of the metal layer, wherein the bottom anti-reflective coating is ashed by the first meta stable plasma.

16. The method of claim 13 further comprising, generating the first meta stable plasma and the second meta stable plasma using process gases comprising nitrogen, helium, and hydrogen.

17. The method of claim 13, wherein the first meta stable plasma is generated by processes comprising:
conducting the nitrogen and the helium into a first input of a shower head to generate a plasma;
filtering to remove ions from the plasma, with nitrogen radicals and helium radicals left in the plasma; and
conducting the hydrogen into a second input of the shower head, wherein the hydrogen is mixed with the nitrogen radicals and the helium radicals to generate the first meta stable plasma.

18. A method comprising:
forming a first high-k dielectric layer and a second high-k dielectric layer on a wafer, wherein the first high-k dielectric layer and the second high-k dielectric layer are formed of a same high-k dielectric material;
performing a first treatment process on the first high-k dielectric layer using a meta stable plasma;
performing a second treatment process on the second high-k dielectric layer using a second meta stable plasma, and wherein the first treatment process and the second treatment process are performed using different process conditions; and
forming a first metal-containing layer and a second metal-containing layer over the first high-k dielectric layer and the second high-k dielectric layer, respectively.

19. The method of claim 18, wherein the different process conditions comprise different nitrogen flow rates.

20. The method of claim 18, wherein the first metal-containing layer and the second metal-containing layer are work function layers, and are deposited in a same deposition process.

* * * * *